United States Patent
Beyhaghi et al.

(10) Patent No.: US 12,324,084 B2
(45) Date of Patent: Jun. 3, 2025

(54) APPARATUS FOR AND METHOD OF CONTROLLING DROPLET GENERATOR PERFORMANCE

(71) Applicant: ASML Netherlands B.V., Veldhoven (NL)

(72) Inventors: Pooriya Beyhaghi, San Diego, CA (US); Bob Rollinger, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 590 days.

(21) Appl. No.: 17/432,985

(22) PCT Filed: Feb. 6, 2020

(86) PCT No.: PCT/EP2020/052933
§ 371 (c)(1),
(2) Date: Aug. 23, 2021

(87) PCT Pub. No.: WO2020/173677
PCT Pub. Date: Sep. 3, 2020

(65) Prior Publication Data
US 2022/0361310 A1 Nov. 10, 2022

Related U.S. Application Data

(60) Provisional application No. 62/959,275, filed on Jan. 10, 2020, provisional application No. 62/928,429, (Continued)

(51) Int. Cl.
*H05G 2/00* (2006.01)
*G03F 7/00* (2006.01)

(52) U.S. Cl.
CPC .......... *H05G 2/006* (2013.01); *G03F 7/70033* (2013.01)

(58) Field of Classification Search
CPC .......... H05G 2/00; H05G 2/001; H05G 2/005; H05G 2/003; H05G 2/006; G02F 7/70033
(Continued)

(56) References Cited

U.S. PATENT DOCUMENTS 7,897,947 B2 3/2011 Vaschenko
8,158,960 B2 4/2012 Vaschenko et al.
(Continued)

FOREIGN PATENT DOCUMENTS

JP 2010533386 A 10/2010
JP 2014186846 A 10/2014
(Continued)

OTHER PUBLICATIONS

Christopher Smith, European International Searching Authority, International Search Report and Written Opinion, corresponding PCT Application No. PCT/EP2020/052933, mailed Jul. 6, 2020, 15 pages total.
(Continued)

*Primary Examiner* — Jason L McCormack
(74) *Attorney, Agent, or Firm* — DiBerardino McGovern IP Group LLC

(57) ABSTRACT

Apparatus for and method of controlling formation of droplets used to generate EUV radiation. The droplet source includes a fluid exiting an nozzle and a sub-system having an electro-actuatable element producing a disturbance in the fluid. The droplet source produces a stream that breaks down into droplets that in turn coalesce into larger droplets as they progress towards the irradiation region. The electro-actuatable element is driven by a control signal having a sine wave component and a square wave component. Various parameters such as a phase difference between the sine wave component and the square wave component are measured
(Continued)

and controlled to minimize the formation of noncoalesced satellite droplets in the stream.

3 Claims, 20 Drawing Sheets

Related U.S. Application Data filed on Oct. 31, 2019, provisional application No. 62/810,768, filed on Feb. 26, 2019.

(58) Field of Classification Search
USPC ................................................. 250/504 R
See application file for complete search history.

(56) References Cited

U.S. PATENT DOCUMENTS

| | | | |
|---|---|---|---|
| 8,513,629 | B2 | 8/2013 | Rajyaguru et al. |
| 9,241,395 | B2 | 1/2016 | Senekerimyan et al. |
| 10,225,917 | B2 | 3/2019 | Fujimaki et al. |
| 2009/0014668 | A1 | 1/2009 | Vaschenko |
| 2012/0228526 | A1* | 9/2012 | Vaschenko .......... G03F 7/70033 |
| | | | 250/504 R |
| 2013/0234051 | A1 | 9/2013 | Rajyaguru et al. |
| 2014/0246607 | A1 | 9/2014 | Bykanov et al. |
| 2014/0284502 | A1 | 9/2014 | Nakano et al. |
| 2015/0230325 | A1 | 8/2015 | Fleurov |
| 2015/0293456 | A1 | 10/2015 | Dijksman et al. |
| 2016/0143121 | A1 | 5/2016 | Lee et al. |
| 2018/0288863 | A1 | 10/2018 | Fujimaki et al. |
| 2018/0364580 | A1 | 12/2018 | Dijksman et al. |

FOREIGN PATENT DOCUMENTS

| | | |
|---|---|---|
| JP | 2016504719 A | 2/2016 |
| JP | 2019505833 A | 2/2019 |
| JP | 2021516775 A | 7/2021 |
| KR | 1020160058511 A | 5/2016 |
| TW | 201247033 A | 11/2012 |
| WO | 2009011739 A1 | 1/2009 |
| WO | 2011112235 A1 | 9/2011 |
| WO | 2013077901 A1 | 5/2013 |
| WO | 2014120985 A1 | 8/2014 |
| WO | 2017121573 A1 | 7/2017 |
| WO | 2017130443 A1 | 8/2017 |
| WO | 2018203370 A1 | 11/2018 |
| WO | 2019137846 A1 | 7/2019 |
| WO | 2019185370 A1 | 10/2019 |

OTHER PUBLICATIONS

Office Action, counterpart Japanese Patent Application No. 2021-547394, mailed Sep. 21, 2023, 6 pages total (including partial English translation of 3 pages).

* cited by examiner

APPARATUS FOR AND METHOD OF CONTROLLING DROPLET GENERATOR PERFORMANCE

CROSS REFERENCE TO RELATED APPLICATION

This application claims priority of U.S. Application No. 62/810,768, which was filed on Feb. 26, 2019, U.S. Application No. 62/928,429, which was filed on Oct. 31, 2019 and of U.S. Application No. 62/959,275, which was filed on Jan. 10, 2020, all of which are incorporated herein in their entirety by reference.

FIELD

The present application relates to extreme ultraviolet ("EUV") light sources and their methods of operation. These light sources provide EUV light by creating plasma from a source or target material. In one application, the EUV light may be collected and used in a photolithography process to produce semiconductor integrated circuits.

BACKGROUND

A patterned beam of EUV light can be used to expose a resist-coated substrate, such as a silicon wafer, to produce extremely small features in the substrate. EUV light (also sometimes referred to as soft x-rays) is generally defined as electromagnetic radiation having wavelengths in the range of about 5 nm to about 100 nm. One particular wavelength of interest for photolithography occurs at around 13.5 nm.

Methods to produce EUV light include, but are not necessarily limited to, converting a source material into a plasma state that has a chemical element with an emission line in the EUV range. These elements can include, but are not limited to, xenon, lithium and tin.

In one such method, often termed laser produced plasma ("LPP"), the desired plasma can be produced by irradiating a source material, for example, in the form of a droplet, stream, or wire, with a laser beam. In another method, often termed discharge produced plasma ("DPP"), the required plasma can be generated by positioning source material having an appropriate emission line between a pair of electrodes and causing an electrical discharge to occur between the electrodes.

One technique for generating droplets involves melting a target material, also sometimes referred to as a source material, such as tin and then forcing the molten source material under high pressure through a relatively small diameter orifice, such as an orifice having a diameter of about 0.1 μm to about 30 μm, to produce a laminar fluid jet having velocities in the range of about 30 m/s to about 200 m/s. Under most conditions, naturally occurring instabilities, e.g. thermal noise or vortex shedding in the stream exiting the orifice, will cause the stream to break up into droplets. These droplets have varying velocities and combine with each other in flight to coalesce into larger droplets.

In the EUV generation processes under consideration here, it is desirable to control the break up/coalescence process. For example, in order to synchronize the droplets with the optical pulses of an LPP drive laser, a repetitive disturbance with an amplitude exceeding that of random noise may be applied to the continuous laminar fluid jet that emanates from the orifice. By applying a disturbance at the same frequency (or its higher harmonics) as the repetition rate of the pulsed laser, the droplets are synchronized with the laser pulses. For example, the disturbance may be applied to the stream by coupling an electro-actuatable element (such as a piezoelectric material) to the stream and driving the electro-actuatable element with a periodic waveform. In one embodiment, the electro-actuatable element will contract and expand in diameter (on the order of nanometers). This change in dimension is mechanically coupled to a capillary that undergoes a corresponding contraction and expansion of diameter. This volume displacement causes acoustic and elastic waves in the capillary tube that ends in the orifice. The target material in the orifice is then accelerated periodically by the acoustic waves ultimately causing widely spaced droplets at the frequency of the drive laser to occur in a frequency range that is far below the natural Rayleigh breakup frequency of the fluid microjets. The natural breakup frequency of the fluid jet is in the range between about 3 and about 15 MHz, whereas the drive laser operation is expected in the range between about 50 and about 160 kHz. This means that to obtain the desired final droplets up many small microdroplets have to be merged into the periodic droplet stream consisting of droplets much larger than the orifice diameter.

As used herein, the term "electro-actuatable element" and its derivatives, means a material or structure which undergoes a dimensional change when subjected to a voltage, electric field, magnetic field, or combinations thereof and includes, but is not limited to, piezoelectric materials, electrostrictive materials, and magnetostrictive materials. Apparatus for and methods of using an electro-actuatable element to control a droplet stream are disclosed, for example, in U.S. Patent Application Publication No. 2009/0014668 A1, titled "Laser Produced Plasma EUV Light Source Having a Droplet Stream Produced Using a Modulated Disturbance Wave" and published Jan. 15, 2009, and U.S. Pat. No. 8,513,629, titled "Droplet Generator with Actuator Induced Nozzle Cleaning" and issued Aug. 20, 2013, both of which are hereby incorporated by reference in their entireties.

The task of the droplet generator is thus to place properly-sized droplets in the primary focus of a collector mirror used to collect the EUV radiation where they will be used as target material for producing the EUV radiation. The droplets must arrive at the primary focus within certain spatial and temporal stability criteria, that is, with position and timing that is repeatable within acceptable margins. They must also arrive at a given frequency and velocity. Furthermore, the droplets must be fully coalesced, meaning that the droplets must be monodisperse (of uniform size) and arrive at the given drive frequency.

For example, the droplet stream should be free of "satellite" droplets, that is, smaller droplets of target material that have failed to coalesce into a main droplet. Meeting these criteria is complicated by the fact that for small orifices and large pressures, it may be necessary to merge many microdroplets using the electro-actuatable element drive form. The operation window is usually very small, making the system sensitive to variations in performance such as performance changes over time. For example, when the performance of the droplet generator changes, it may produce droplets that are not fully coalesced by the time they reach the primary focus. Eventually the droplet generator performance will deteriorate to the point that the droplet generator must be taken offline for maintenance or replacement.

One way to control coalescence is to impose a hybrid waveform on the molten target material exiting the nozzle. A hybrid waveform is a periodic piezo excitation waveform that may be used to control and optimize the coalescence process that is used in various droplet generators on various systems that are operated at various power levels such as 250 W. See, for example, International Patent Application No. PCT/EP2019/050100, filed on Jan. 3, 2019 and titled "Apparatus for and Method of Controlling Coalescence of Droplets in a Droplet Stream," which is hereby incorporated by reference in its entirety.

There is a need to be able to control droplet generation and coalescence in a manner that allows for optimization of these processes.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect of an embodiment there is disclosed apparatus comprising a target material dispenser having a nozzle and adapted to provide a stream of target material that breaks up into first droplets after exiting the nozzle, an electro-actuatable element mechanically coupled to the target material dispenser and arranged to induce velocity perturbations in the stream based on an applied waveform, the velocity perturbations causing first droplets to ultimately coalesce in one or more stages into second droplets larger than the first droplets within a coalescence distance from the nozzle, and a waveform generator electrically coupled to the electro-actuatable element and adapted to generate the applied waveform, the waveform having a sine wave component and a square wave component, the sine wave component having an amplitude and the square wave component having a phase difference from the sine wave component, the amplitude and the phase difference being selected to minimize the coalescence distance while avoiding an abrupt change in the coalescence distance. The electro-actuatable element may be a piezoelectric element.

According to another aspect of an embodiment there is disclosed apparatus comprising a target material dispenser having a nozzle and adapted to provide a stream of target material that breaks up into first droplets after exiting the nozzle, an electro-actuatable element mechanically coupled to the target material dispenser and arranged to induce velocity perturbations in the stream based on an applied waveform, the velocity perturbations causing first droplets to ultimately coalesce in one or more stages into second droplets larger than the first droplets within a coalescence distance from the nozzle, the second droplets being spaced such that the second droplets pass a fixed point at a crossing interval, a crossing interval detector arranged to determine a crossing interval of the second droplets and to generate a crossing interval signal, and a waveform generator electrically coupled to the electro-actuatable element and adapted to generate the applied waveform and adapted to generate the applied waveform based at least in part on the crossing interval signal.

According to another aspect of an embodiment there is disclosed a method comprising the steps of providing a stream of target material using a target material dispenser, the target material dispenser comprising an electro-actuatable element arranged to induce velocity perturbations in the stream based on a droplet control signal, determining whether the stream includes satellite droplets and generating a satellite detection signal indicating whether the stream includes satellite droplets, generating a waveform based at least in part on the satellite detection signal, and supplying the waveform to the target material dispenser. The method may further comprise a step of determining a crossing interval of the stream and generating a crossing interval signal and wherein the step of generating a waveform comprises generating the waveform based at least in part on the crossing interval signal.

According to another aspect of an embodiment there is disclosed a method of determining a transfer function of a nozzle of a target material dispenser, the method comprising the steps of dispensing a stream of EUV target material from the target material dispenser, applying a waveform to an electro-actuatable element arranged to induce velocity perturbations in the stream in response to the control signal, determining a minimum value of an amplitude of a sine wave component of the waveform for which the stream does not include satellites, determining a dependence of coalescence length on a phase difference between the sine wave component and a square wave component of the control signal and determining a jump boundary phase difference at which a discontinuity in the dependence occurs, determining a slope of a dependence of the jump boundary phase on the minimum value, determining a drag coefficient based on the slope, and determining a transfer function at a frequency of the sine wave component based on the minimum value and the drag coefficient.

According to another aspect of an embodiment there is disclosed a method of optimizing coalescence behavior for a stream of EUV target material from a target material dispenser comprising an electro-actuatable element arranged to induce velocity perturbations in the stream in response to an applied control signal, the method comprising the steps of determining a minimum value of an amplitude of a sine wave component of the control signal for which the stream does not include satellites, determining a dependence of coalescence length on a phase difference between the sine wave component and a square wave component of the control signal and determining a jump boundary phase difference at which a discontinuity in the dependence occurs, determining a slope of a dependence of the jump boundary phase on the minimum value, determining a drag coefficient based on the slope, determining a designed phase delay based on the drag coefficient, and determining an optimum phase difference as a difference between the jump boundary phase difference and the designed phase delay.

According to another aspect of an embodiment there is disclosed a method of controlling coalescence behavior for a stream of EUV target material from a target material dispenser comprising an electro-actuatable element arranged to induce velocity perturbations in the stream in response to an applied control signal having a sine wave component and a square wave component, the method comprising the steps of determining a width $L_n$ of a largest range of adjacent values of a phase difference between the sine wave component and the square wave component for which the stream does not include satellites, determining a width $L_2$ of a largest range of adjacent values of the phase difference between the sine wave component and the square wave component for which the stream does include satellites, determining a value $S_m$ as a statistical measure of variation in the stream crossing interval in the range having width $L_n$, determining a value YZstability as a statistical measure of a vector $[ry_m, rz_m]$ where $ry_m$ is as a statistical measure of stability of the stream in a y direction and $rz_m$ is a as a statistical measure of stability of the stream in a z direction; and determining a cost function $$W_1 YZStability + W_2 S_m + W_3 \frac{(L_n - L_1)}{L_n} + W_4 \frac{(2\pi - L_n - L_2)}{(2*pi - L_n)},$$

where $W_1$, $W_2$, $W_3$, $W_4$ are some real positive numbers; and adjusting parameters of the sine wave component and the square wave component to minimize the cost function.

According to another aspect of an embodiment there is disclosed a method comprising the steps of using a target material dispenser having a nozzle to provide a stream of target material that breaks up into first droplets after exiting the nozzle, using an electro-actuatable element mechanically coupled to the target material dispenser to induce velocity perturbations in the stream based on an applied waveform, the velocity perturbations causing first droplets to ultimately coalesce in one or more stages into second droplets larger than the first droplets within a coalescence distance from the nozzle, and using a waveform generator electrically coupled to the electro-actuatable element to generate the applied waveform, the waveform having a sine wave component and a square wave component, the sine wave component having an amplitude and the square wave component having a phase difference from the sine wave component, the amplitude and the phase difference being selected to minimize the coalescence distance while avoiding an abrupt change in the coalescence distance.

According to another aspect of an embodiment there is disclosed a method of operating a target material dispenser in an EUV source, the method comprising the steps of generating a waveform having a sine wave component and a square wave component, the sine wave component having an amplitude and the square wave component having a phase difference from the sine wave component, applying the waveform to an electro-actuatable element mechanically coupled to the target material dispenser having a nozzle to provide a stream of target material that breaks up into first droplets after exiting the nozzle and then coalesces in one or more stages into second droplets larger than the first droplets within a coalescence distance from the nozzle, for a plurality amplitudes, scanning a plurality of phase differences to identify jump boundary combinations of amplitude and phase difference at which an abrupt change in the coalescence distance occurs; to generate a jump boundary curve, and during operation of the EUV source, using combinations of amplitude and phase difference based at least in part on the jump boundary curve.

According to another aspect of an embodiment there is disclosed a method comprising releasing of a stream of initial droplets of a first size from a droplet generator under control of an electric signal, the stream of initial droplets undergoing at least one coalescence into a stream of final droplets of a second size larger than the first size after travelling a coalescence length, the electric signal having a first periodic component and a second periodic component out of phase from the first periodic component by a phase difference, operating the droplet generator with the phase difference at a value at which the stream of final droplets does not include any satellite droplets smaller than the second size, varying the value of the phase difference phase until a satellite droplet occurs in the stream of final droplets to detect a jump boundary in a functional dependence of coalescence length on the value of the phase difference.

Operating the droplet generator with the phase difference at a value at which the stream of final droplets does not include any satellite droplets smaller than the second size may comprise operating the droplet generator with the phase difference at a value expected to be below the value at which a satellite droplet occurs in the stream of final droplets, and varying the value of the phase difference phase until a satellite droplet occurs in the stream of final droplets to detect a jump boundary in a functional dependence of coalescence length on the value of the phase difference may comprise increasing the value of the phase difference phase until a satellite droplet occurs in the stream of final droplets to detect a jump boundary in a functional dependence of coalescence length on the value of the phase difference. The first periodic component may have a first frequency and the second periodic component may have a second frequency which is an integral multiple including one of the first frequency. One of the first periodic and the second periodic component may be sinusoidal and the other of the first periodic and the second periodic component is a square wave.

According to another aspect of an embodiment there is disclosed a method of controlling coalescence behavior for a stream of EUV target material from a target material dispenser comprising an electro-actuatable element arranged to induce velocity perturbations in the stream in response to an applied control signal having a sine wave component and a square wave component, the method comprising the steps of determining a first number of ranges of adjacent values of a phase difference between the sine wave component and the square wave component for which the stream does not include satellites, determining a second number of ranges of adjacent values of the phase difference between the sine wave component and the square wave component for which the stream does include satellites, and determining coalescence behavior of the stream of EUV target material to be acceptable if the first number and the second number are equal to one.

Further embodiments, features, and advantages of the present invention, as well as the structure and operation of the various embodiments are described in detail below with reference to accompanying drawings.

BRIEF DESCRIPTION OF THE DRAWINGS

The accompanying drawings, which are incorporated herein and form part of the specification, illustrate the methods and systems of embodiments of the invention by way of example, and not by way of limitation. Together with the detailed description, the drawings further serve to explain the principles of and to enable a person skilled in the relevant art(s) to make and use the methods and systems presented herein. In the drawings, like reference numbers indicate identical or functionally similar elements.

Figure 1:
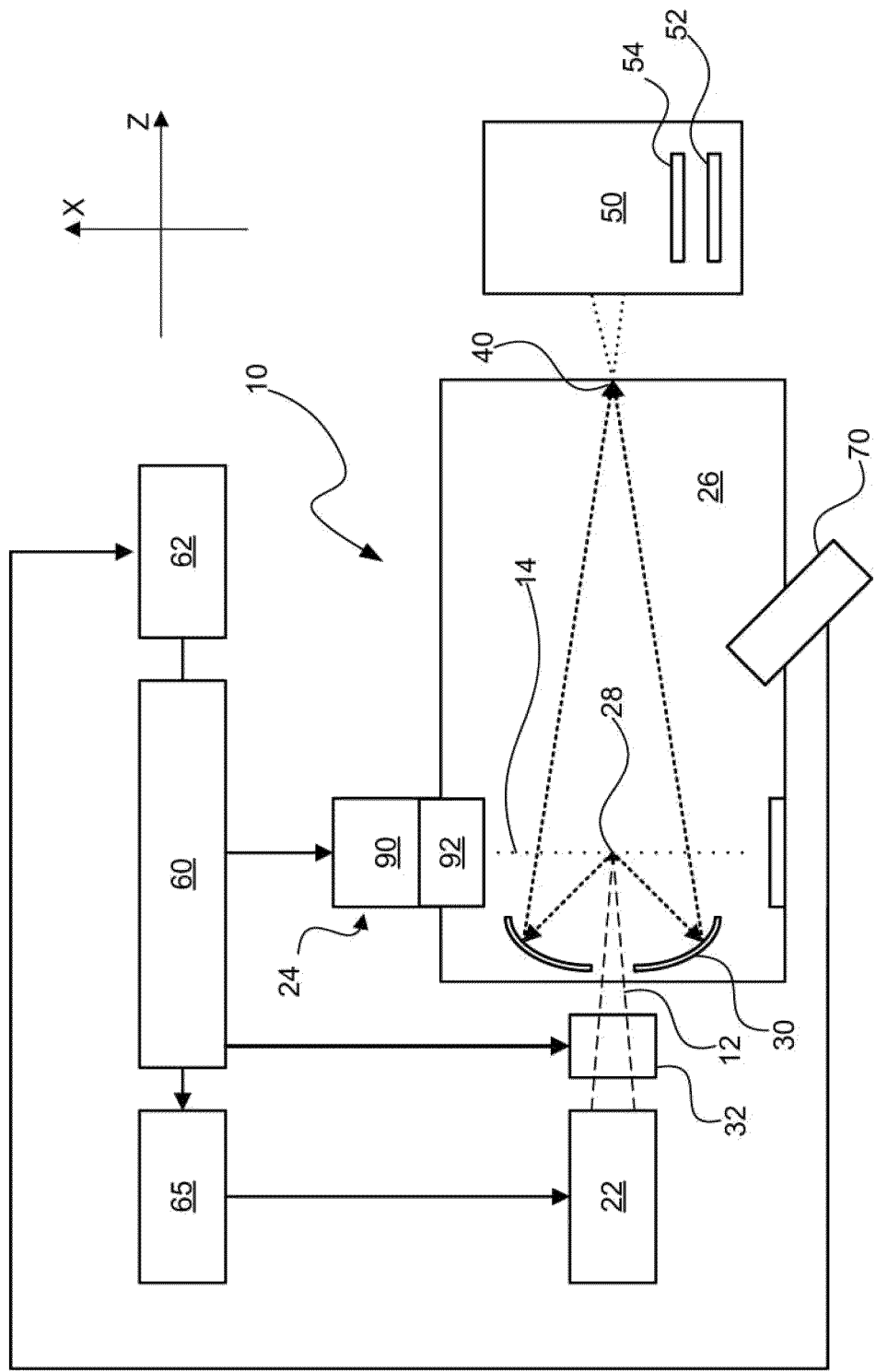
FIG. 1 is a simplified schematic view of an EUV light source coupled with an exposure device.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments.

Before describing such embodiments in more detail, however, it is instructive to present an example environment in which embodiments of the present invention may be implemented. In the description that follows and in the claims the terms "up," "down," "top," "bottom," "vertical," "horizontal," and like terms may be employed. These terms are intended to show relative orientation only and not any orientation with respect to gravity.

With initial reference to FIG. 1 there is shown a schematic view of an exemplary EUV radiation source, e.g., a laser produced plasma EUV radiation source 10 according to one aspect of an embodiment of the present invention. As shown, the EUV radiation source 10 may include a pulsed or continuous laser source 22, which may for example be a pulsed gas discharge $CO_2$ laser source producing a beam 12 of radiation at a wavelength generally below 20 μm, for example, in the range of about 10.6 μm or to about 0.5 μm or less. The pulsed gas discharge $CO_2$ laser source may have DC or RF excitation operating at high power and at a high pulse repetition rate.

The EUV radiation source 10 also includes a target delivery system 24 for delivering source material in the form of liquid droplets or a continuous liquid stream. In this example, the source material is a liquid, but it could also be a solid or gas. The source material may be made up of tin or a tin compound, although other materials could be used. In the system depicted the source material delivery system 24 introduces droplets 14 of the source material into the interior of a vacuum chamber 26 to an irradiation region 28 where the source material may be irradiated to produce plasma. It should be noted that as used herein an irradiation region is a region where source material irradiation may occur, and is an irradiation region even at times when no irradiation is actually occurring. The EUV light source may also include a beam focusing and steering system 32 as will be explained in more detail below in conjunction with FIG. 2.

In the system shown, the components are arranged so that the droplets 14 travel substantially horizontally. The direction from the laser source 22 towards the irradiation region 28, that is, the nominal direction of propagation of the beam 12, may be taken as the Z axis. The path the droplets 14 take from the source material delivery system 24 to the irradiation region 28 may be taken as the X axis. The view of FIG. 1 is thus normal to the XZ plane. Also, while a system in which the droplets 14 travel substantially horizontally is depicted, it will be understood by one having ordinary skill in the art the other arrangements can be used in which the droplets travel vertically or at some angle with respect to gravity between and including 90 degrees (horizontal) and 0 degrees (vertical).

The EUV radiation source 10 may also include an EUV light source controller system 60, which may also include a laser firing control system 65, along with the beam steering system 32. The EUV radiation source 10 may also include a detector such as a droplet position detection system which may include one or more droplet imagers 70 that generate an output indicative of the absolute or relative position of a droplet, e.g., relative to the irradiation region 28, and provide this output to a target position detection feedback system 62.

The droplet position detection feedback system 62 may use the output of the droplet imager 70 to compute a droplet position and trajectory, from which a droplet position error can be computed. The droplet position error can be computed on a droplet-by-droplet basis, or on average, or on some other basis. The droplet position error may then be provided as an input to the light source controller 60. In response, the light source controller 60 can generate a control signal such as a laser position, direction, or timing correction signal and provide this control signal to the laser beam steering system 32. The laser beam steering system 32 can use the control signal to change the location and/or focal power of the laser beam focal spot within the chamber 26. The laser beam steering system 32 can also use the control signal to change the geometry of the interaction of the beam 12 and the droplet 14. For example, the beam 12 can be made to strike the droplet 14 off-center or at an angle of incidence other than directly head-on.

As shown in FIG. 1, the source material delivery system 24 may include a source material delivery control system 90. The source material delivery control system 90 is operable in response to a signal, for example, the droplet position error described above, or some quantity derived from the droplet position error provided by the system controller 60, to adjust paths of the source material through the irradiation region 28. This may be accomplished, for example, by repositioning the point at which a source material delivery mechanism 92 releases the droplets 14. The droplet release point may be repositioned, for example, by tilting the target delivery mechanism 92 or by shifting the target delivery mechanism 92. The source material delivery mechanism 92 extends into the chamber 26 and is preferably externally supplied with source material and connected to a gas source to place the source material in the source material delivery mechanism 92 under pressure.

Continuing with FIG. 1, the radiation source 10 may also include one or more optical elements. In the following discussion, a collector 30 is used as an example of such an optical element, but the discussion applies to other optical elements as well. The collector 30 may be a normal incidence reflector, for example, implemented as an MLM with additional thin barrier layers, for example $B_4C$, $ZrC$, $Si_3N_4$ or C, deposited at each interface to effectively block thermally-induced interlayer diffusion. Other substrate materials, such as aluminum (Al) or silicon (Si), can also be used. The collector 30 may be in the form of a prolate ellipsoid, with a central aperture to allow the laser radiation 12 to pass through and reach the irradiation region 28. The collector 30 may be, e.g., in the shape of a ellipsoid that has a first focus at the irradiation region 28 and a second focus at a so-called intermediate point 40 (also called the intermediate focus 40) where the EUV radiation may be output from the EUV radiation source 10 and input to, e.g., an integrated circuit lithography scanner or stepper 50 which uses the radiation, for example, to process a silicon wafer work piece 52 in a known manner using a reticle or mask 54. The mask 54 may be transmissive or reflective. For EUV applications the mask 54 is generally reflective. The silicon wafer work piece 52 is then additionally processed in a known manner to obtain an integrated circuit device.

Figure 2:
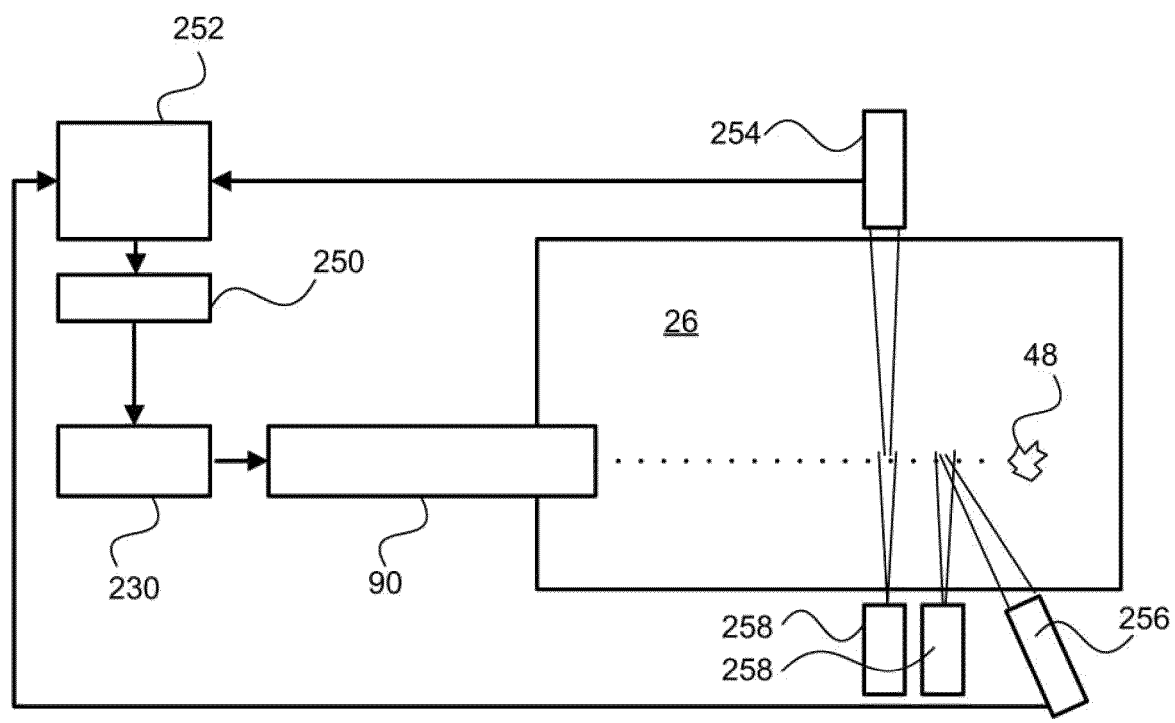
FIG. 2 is a schematic diagram of a droplet generation subsystem for an EUV light source.

FIG. 2 illustrates the droplet generation system in more detail. The source material delivery system 90 delivers droplets to an irradiation site/primary focus 48 within chamber 26. A waveform generator 230 provides a drive waveform to an electro-actuatable element in the droplet generator 90 which induces a velocity perturbation into the droplet stream. The waveform generator 230 operates under the control of a controller 250 least partially on the basis of data from a data processing module 252. The data processing module receives data from one or more detectors. In the example shown, the detectors include a camera 254 and a photodiode 256. The droplets are illuminated by one or more lasers 258. In this typical arrangement, the detectors detect/image droplets at a point in the stream where coalescence is expected to have occurred.

Figure 3:
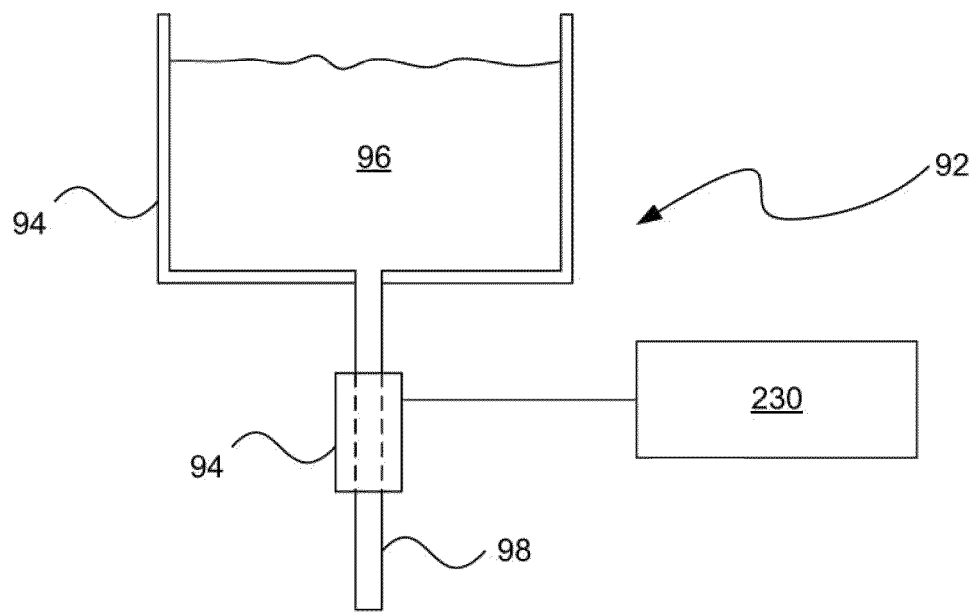
FIG. 3 illustrates a technique for coupling one or more electro-actuatable elements with a fluid to create a disturbance in a stream exiting an orifice.

FIG. 3 illustrates the components of a simplified droplet source 92 in schematic format. As shown there, the droplet source 92 may include a reservoir 94 holding a fluid 96, e.g. molten tin, under pressure. Also shown, the reservoir 94 may be formed with a nozzle 98 allowing the pressurized fluid 96 to flow out of the reservoir 94 establishing a continuous stream which subsequently breaks into a plurality of droplets. Waveforms generated by waveform generator 230 having are used to drive electro-actuatable element 150 to produce droplets for EUV output. The electro-actuatable element 150 produces a disturbance in the fluid which generates droplets having differing initial velocities causing at least some adjacent droplet pairs to coalesce together prior to reaching the irradiation region. The ratio of initial microdroplets to coalesced droplets may be any number, for example, in the range of about 10 to about 500.

Figure 4:
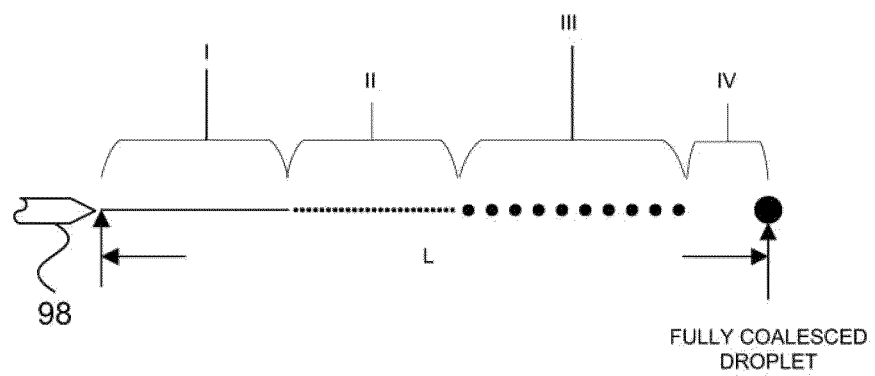
FIG. 4 is a diagram illustrating states of coalescence in a droplet stream.

The overall droplet coalescence process may be regarded as a succession of multiple coalescence steps or regimes evolving as a function of distance from the nozzle. This is shown in FIG. 4. For example, in a first regime I, that is, when the target material first exits the orifice or nozzle, the target material is in the form of a velocity-perturbed laminar fluid jet. In a second regime II, the fluid jet breaks up into a series of microdroplets having varying velocities. In the third regime III, measured either in time of flight or by distance from the nozzle, the microdroplets coalesce into droplets of an intermediate size, referred to as subcoalesced droplets, having varying velocities with respect to one another. In the fourth regime IV the subcoalesced droplets coalesce into droplets having the desired final size. The number of sub-coalescence steps can vary. The distance from the nozzle to the point at which the droplets reach their final coalesced state is the coalescence distance or length L. Ideally, the coalescence distance of the droplets is as short as possible. When the droplets have coalesced into bigger droplets, they are less sensitive for source conditions such as hydrogen flow and ion impact.

The coalescence process when controlled with an excitation signal may thus be understood as having an initial partial coalescence or sub-coalescence regime that generates intermediate-sized droplets that have approximately 2 µs spacings (higher frequency (typically 500 kHz) droplets), and a main coalescence in which the sub-coalesced droplets merge into main droplets with approximately 20 µs spacings (50 kHz) although other spacings are produced in other embodiments.

Figure 5A:
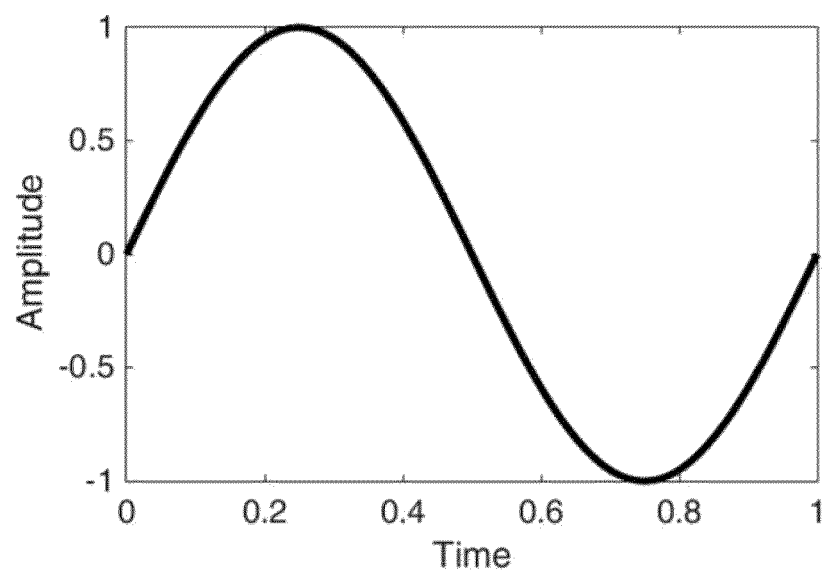
FIGS. 5A and 5B show components of a composite hybrid waveform such as may be used according to one aspect of an embodiment.
Figure 5B:
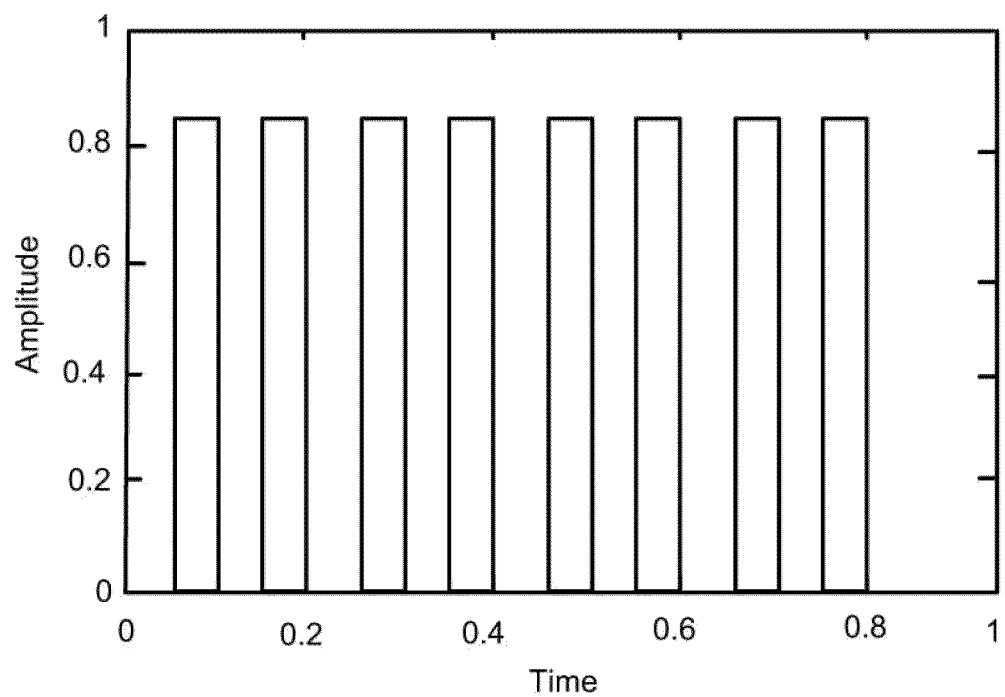

Control of the breakup/coalescence process thus involves controlling the droplets such that they coalesce sufficiently before reaching the irradiation region and have a frequency corresponding to the pulse rate of the laser being used to irradiate the coalesced droplets. A hybrid waveform may be supplied to the electro-actuatable element to control the coalescence process of Rayleigh breakup microdroplets into fully coalesced droplets of a frequency corresponding to the laser pulse rate. In essence, the hybrid waveform may be composed of a combination of a first low frequency periodic waveform and a second higher frequency periodic waveform. As an example, the hybrid waveform may be made up of a low frequency sinusoidal wave and a higher frequency square or block wave. It will be understood, however, that the higher frequency periodic waveform need not necessarily be a square wave and teachings herein related to implementations in which a square wave is used may be taken as the context allows as equally applicable to implementations in which the second, higher frequency periodic signal is not a square wave. Thus the hybrid waveform signal may be made up of a low frequency sine wave (such as at 50 kHz) as shown in FIG. 5A and a high frequency block wave (such as at 500 kHz) as shown in FIG. 5B. In the figures the scale of the time and amplitude axes are arbitrary. Such a hybrid waveform may be characterized by reference to five adjustable parameters including a) sine-amplitude, b) square-phase, that is, the phase difference between the sine wave and the square wave, c) square-amplitude d) square-uptime (duty cycle) and d) square-frequency. The main coalescence process depends primarily on the sine-amplitude and the square-phase, and may further depend on the other three adjustable parameters named above.

As mentioned, if full coalescence is not achieved, then the droplet stream will include smaller droplets referred to as satellite droplets or microsatellites. The presence of satellite droplets can be detected by any one or combination of several methods, for example, the use of a droplet detection module (DDM), crossing interval, droplet formation camera (DFC), or even through monitoring changes in the EUV signals. Systems and methods for monitoring the droplet stream are disclosed, for example, in U.S. Pat. No. 9,241,395, issued Jan. 19, 2016, titled "System and Method for Controlling Droplet Timing in an LPP EUV Light Source", the entire contents of which are hereby incorporated by reference. However, using monitoring equipment that is relatively remote from the stream, it is difficult to directly observe satellites or to measure the coalescence distance. It would be useful to have ways to infer conditions such as whether satellites exist, or the coalescence length, from parameters that are more directly ascertainable.

Sub-coalescence is an important part of the coalescence process using a hybrid waveform excitation signal because if the sub-coalescence length increases, the main and sub-coalescence processes will interfere, which increases the coalescence length. The increased coalescence length increases the likelihood of satellites caused by plasma pressure from the irradiation region.

Also, poor sub-coalescence will increase the velocity jitter of the subcoalesced droplets (which may be at a frequency of 500 kHz) which can cause either low-frequency satellites (presence of satellites next to a fraction of the main droplets) or poor droplet timing. Satellites and poor timing may impact dose stability and collector lifetime in an EUV system.

As a result, it is advantageous to first characterize the sub-coalescence process and use the characterization as at least a partial basis for controlling the time-varying signal that creates pressure variations in the droplet generator nozzle. This determination can be performed iteratively, for example, to improve the coalescence of the droplets (e.g., reduce the incidence of satellite droplets). In situations where such a determination is used to improve a hybrid waveform, the procedure may be referred to as a hybrid waveform optimization (HWO).

As alluded to above, one of the main challenges in optimizing the parameters of the hybrid waveform excitation signal is to determine the characteristics of the sub-coalescence process with the low frequency droplet metrology equipment that may typically be available on EUV systems. In various systems, there may be provision for image-based, low-frequency satellite-detection at the irradiation region (e.g., the primary focus of a collector). The sampling frequency (rate) of this signal may be less than 20 Hz, which is significantly less than the main droplet frequency which may be 50 kHz. There may also be provision for determining a crossing interval, which is the timing between two droplets. The frequency (rate) of this signal can be the same as the main droplet frequency (such as 50 kHz). There may also be provision for image-based position measurement of the droplet in y and z direction: The frequency (rate) of this signal may be 1 kHz which is less than main droplet frequency.

In general the signals from these measurements and detections contain only information about the condition of the main droplets, and metrology equipment may not be available to directly measure sub-coalescence performance. According to one aspect of an embodiment, there is disclosed herein systems and methods to quantify sub-coalescence performance using the metrology described above. This enables detecting the existence of low-frequency satellites after tuning the hybrid waveform excitation signal such as may not be directly observable by typical metrology equipment. It also enables optimization of sub-coalescence performance using measurements available from conventional metrology equipment. It also enables characterizing a "health metric" to characterize the performance of the droplet generator nozzle in generating stable subcoalesced droplets. It also enables optimization of sub-coalescence to increase the robustness of tuning solutions.

According to an aspect of an embodiment, HWO may be used to optimize parameters such as combinations of the five parameters described above of the hybrid waveform excitation signal. For example, in various implementations of the optimization, two of these parameters (square-amplitude and square-uptime) may be used to control the sub-coalescence process.

In particular, phase scan data may be used to quantify sub-coalescence performance. As used here, phase scan refers to the process of scanning the square phase parameter and determining a set of conditions for particular values of the scan phase. One of the conditions is whether satellites exist at that value of the square phase. This is a Boolean "yes or no" determination that can be used to set a flag. Another of the conditions detected may be the spread of timing between two droplets, the timing being referred to as the crossing interval. For example, a statistical measure of this spread, such as three sigma, i.e., intervals that are within three standard deviations of the mean, can be determined. This may be referred to as the three sigma crossing interval and denoted by $s_i$. Another condition that may be detected is the three sigma of the y and z position of the droplet stream. At each setting, the value of 3-sigma of the droplet location in y and z is determined and is denoted by $ry_i$, and $rz_i$.

Figure 6:
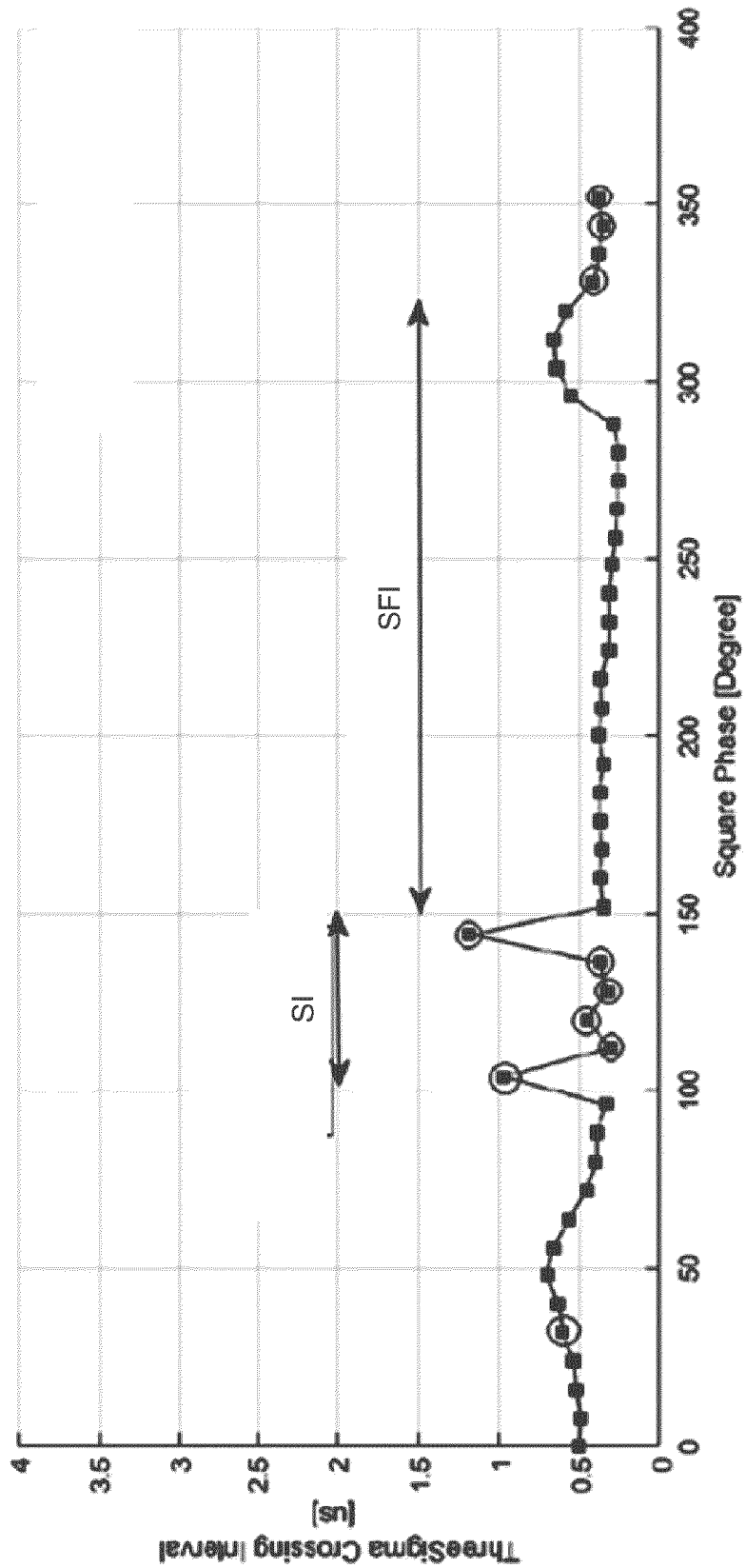
FIG. 6 is a diagram of a satellite formation as a function of phase difference according to one aspect of an embodiment.

This data may then be used to optimize sub-coalescence performance. First, looking at presence or absence of satellites, there will in general be a region of adjacent square phase settings that yield satellites, adjacent meaning that the region is not interrupted by values that do not yield satellites. Note that this region can be determined by satellite detection using the DFC. The results are shown in the representative example in FIG. 6 which is a plot of the three sigma crossing interval as a function of square phase. In FIG. 6 values for square phase which do not yield satellites are indicated by a plain dot. Values for square phase which do yield satellites are indicated by a circled dot. The region (phase range of adjacent phase values) in which satellites occur may be referred to as a satellite island SI. A region in which there are no satellites may be similarly referred to as a satellite-free island SFI. According to one technique for analyzing this data, the width in square-phase $L_1$ of the widest satellite-free island is determined. The satellite-free island width in case of perfect sub-coalescence is denoted as $L_n$. In other words, $L_n$ is the theoretical value of island width assuming that the coalescence process started with a uniformly distributed sub-coalescence droplets.

Note that $L_n$ is a function of the product TF (the nozzle transfer function at 50 kHz) and sine Ampl (the amplitude of the sine wave component) and the droplet drag coefficient. If the measured island width matches $L_n$ then uniformly distributed sub-coalescence droplets are present.

Next, the width of the widest satellite island is determined. This width is denoted by $L_2$. In the case of perfect sub-coalescence, this quantity would be equal to $2\pi - L_n$.

In the next step a statistical measure such as the p-norm of the crossing interval data inside the satellite-free region is determined and denoted as $S_m$.

Next, a statistical measure such as the p-norm of three-sigma of y stability is determined as ry_m and a statistical measure such as the p-norm of three-sigma of z stability is determined as rz_m. Then the YZStability is determined as a weighted p-norm of vector [$ry_m, rz_m$].

Based on the above determinations, a sub-coalescence quantifier may be defined as the values that minimize a cost function, for example, as follows:

$$W_1 YZStability + W_2 S_m + W_3 \frac{(L_n - L_1)}{L_n} + W_4 \frac{(2\pi - L_n - L_2)}{(2*pi - L_n)},$$

where $W_1$, $W_2$, $W_3$, $W_4$ are some real positive numbers.

The above metric can provide a useful estimate of the likelihood of the existence of plasma induced satellites. In other words, the sub-coalescence parameters may be set to the minimizer of the above cost function quantity. By setting the sub-coalescence parameters to the minimizer of the above cost function quantity, the presence of satellites may be minimized, thus optimizing sub-coalescence performance.

As another metric of sub-coalescence performance, sub-coalescence performance may be deemed unacceptable of if multiple satellite-free regions are found. In other words, if sub-coalescence performance is acceptable, then the dependence of the three sigma crossing interval as a function of square phase should have one satellite-free region and one satellite region.

As mentioned, satellites appear when sub-coalescence performance breaks down. Sub-coalescence is related to the high frequency component of the nozzle transfer function. A metric related to sub-coalescence as above therefore gives feedback on that component of the nozzle transfer function.

The above technique/metric also provides an objective function for the optimization process of HWO. It also provides a metric to quantify droplet generator performance with respect to the sub-coalescence process.

The techniques described herein may also reduce the likelihood of generating plasma induced satellites, increase the longevity (robustness) of tuning solutions that are determined by HWO, and provide a performance indicator that is based on sub-coalescence performance to support swap decisions, i.e. decisions to disable and swap out the DG.

Figure 7:
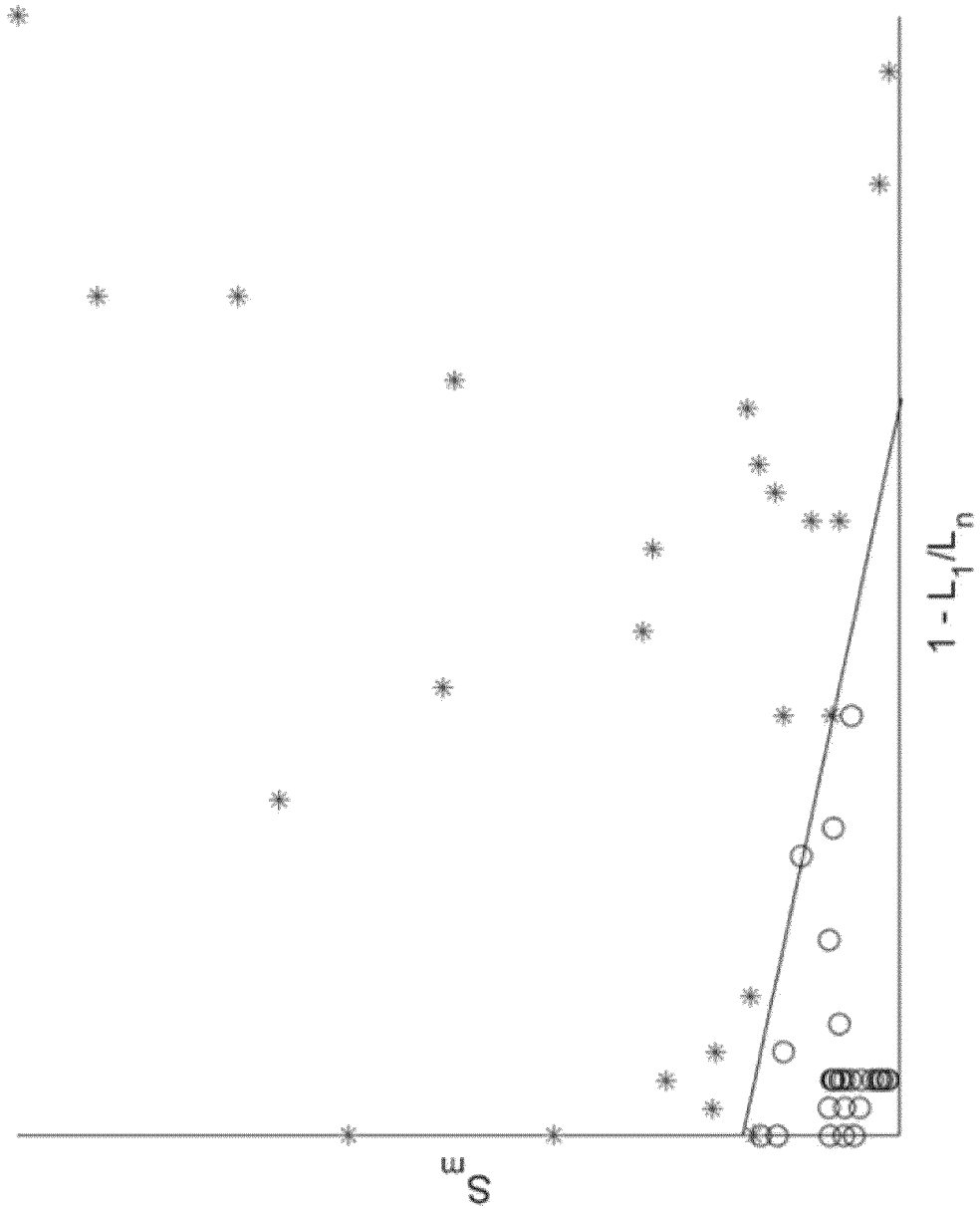
FIG. 7 is a diagram of a satellite formation behavior as a function of crossing interval and a ratio of the lengths of regions having satellites to regions not having satellites according to one aspect of an embodiment.

For an ensemble of phase scans, the above metrics (more specifically, $L_1$ and $S_m$) can be calculated and it can be determined which phase scans yield plasma induced satellites. The phase scans with and without plasma-induced satellites can be classified based on a linear combination of these two metrics. In FIG. 7 the phase-scans with plasma-induced satellites are indicated by the asterisks, and phase-scans without plasma-induced satellites are indicated by open circles. It is thus possible to predict the probability for plasma induced satellites based on phase-scan data. This data can be obtained in the absence of plasma when the droplet generator is being tuned.

The coalescence length decreases approximately linearly as sine-amplitude increases, based on both coalescence simulations and on bench testing in vacuum. The minimum coalescence length is located at the center of the satellite-free region that is constructed by varying the square-phase.

The term "breaking sine-amplitude" is used to refer to a minimum value for the sine-amplitude that can generate a satellite-free setup. It is a function of the drag coefficient. It can be used to correct a transfer function to account for drag. Typically the transfer function is determined based on the assumption that the effect of drag on the droplets in the EUV vessel is negligible. In actuality, the hydrogen flows in the vessel can cause the droplets to experience a non-negligible amount of drag. In essence, the drag force is determined and from this the braking sine amplitude is determined. This leads to the corrected transfer function. This transfer function calculation may need to be corrected based on the drag coefficient.

In addition, it has been determined that drag forces that result from the flows of hydrogen in the vicinity of droplets and the steady vessel pressure may have a significant impact on the coalescence process. Drag forces that act on the coalescence droplets require special attention in the optimization process of the parameters of hybrid waveform. Estimation of the transfer function based on the breaking sine-amplitude in HWO procedures may not be accurate without consideration of the presence of drag forces. Also, in the presence of drag forces, the center of the satellite-free region (in square-phase space) is not the minimizer of the coalescence length.

Regarding drag force, the droplets in the regimes under consideration may be treated as spheres each having a diameter d. Also in the regimes under consideration the Reynolds number is relatively small so that the drag force $F_D$ for a fixed velocity of the gas flowing past the sphere can be approximated as follows:

$$F_D = -\frac{3\pi\mu d_p}{C(Kn)}(V_p - U) \cdot C_D(Re_p)\frac{Re_p}{24}$$

where $\mu$ is the gas viscosity, $d_p$ is the particle diameter, $C(Kn)$ is a slip correction factor for the Knudsen number given by $2\lambda/d_p$, $V_p$ is the particle velocity, U is the fluid local velocity, and $C_D(Re_p) Re_p/24$ is a non-Stokesian correction for fluid inertial effects. See Daniel J. Rader, Anthony S. Geller, 3—*Transport and Deposition of Aerosol Particles*, Editor(s): Rajiv Kohli, K. L. Mittal, Developments in Surface Contamination and Cleaning, William Andrew Publishing, 2008, Pages 189-266.

One impact of taking drag forces into account is that the location of the minimizer of coalescence length becomes partially dependent on vessel pressure. The coalescence length is a discontinuous function of the parameters of the excitation signal; the minimizer of the coalescence length (which is close to the discontinuity) is not a robust operating point with respect to changes in the nozzle transfer function.

As described an HWO procedure may optimize the five parameters of the hybrid waveform excitation signal discussed above. In various implementations of this procedure, two of these parameters (sine-amplitude and square-phase) may be used to control the main coalescence process and the remaining parameters may be used to control sub-coalescence. Optimization procedures that account for drag forces offer the possibility of improved performance in comparison to optimizations that assume negligible drag forces. This is especially so where the vessel pressure is not negligible and hydrogen flows are present.

Also, as mentioned, the coalescence length is the minimum distance from the nozzle at which all microdroplets are merged, e. g. 50 kHz droplets. A satellite-free setup is obtained if coalescence length is less than the distance between the nozzle and the primary focus of the EUV collector. The ideal operating point would have a small coalescence length to provide robustness against hydrogen flows and shock waves that originate from the plasma.

Figure 8:
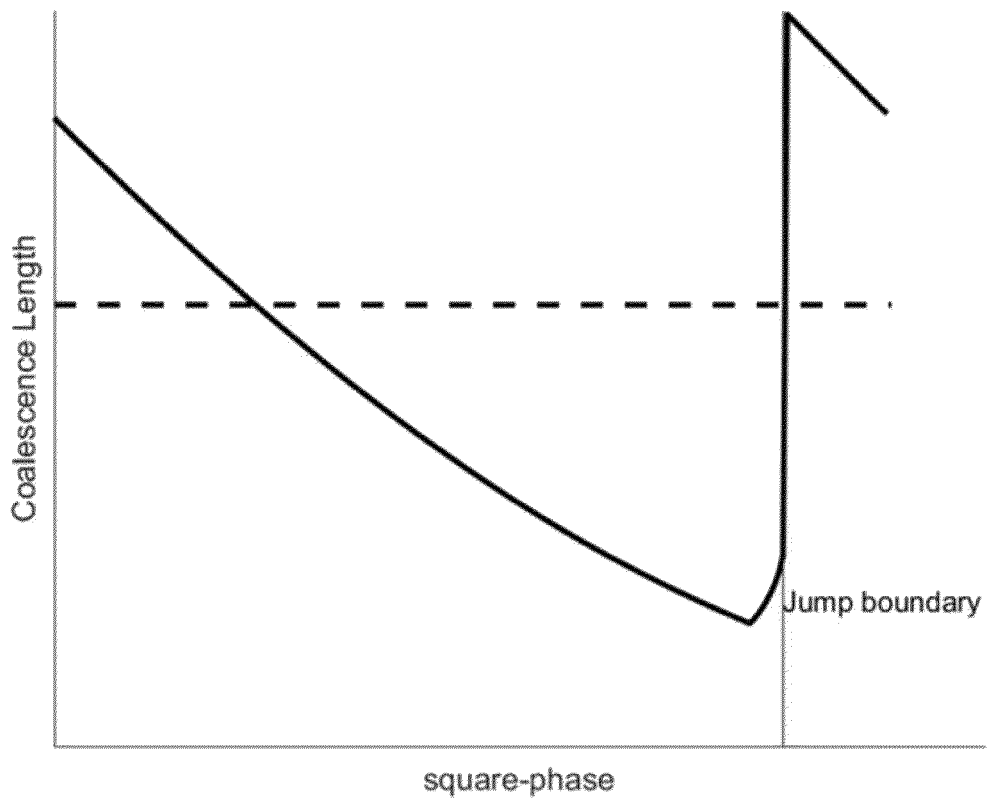
FIG. 8 is a diagram of coalescence length dependence on phase difference according to one aspect of an embodiment.

The functional dependence of coalescence length on the square phase has a discontinuity in the presence of drag. The location of this discontinuity is one of the boundaries of the satellite-free region and is referred to as the jump boundary as shown in FIG. 8. In simplified versions of HWO procedures, the operating square-phase may simply be set to the center of the satellite-free region which is not the minimizer of the coalescence length in the presence of drag. There are advantages, however, to using an HWO procedure that can determine an operating square-phase value that is robust for nozzle performance variations and that may provide a smaller coalescence length. Note that, in various implementations, this process may be executed using only the satellite-detector target formation metrology equipment (TFM) and the DFC at the primary focus/irradiation region.

To recapitulate, for a fixed value of sine-amplitude, square-uptime, square-amplitude, and square-frequency, the coalescence length is a discontinuous function of square-phase. That is to say, the plot of coalescence length as a function of square phase will exhibit a discontinuity for some value of square phase. Just prior to the discontinuity coalescence length will be at or near a minimum value while at the discontinuity the coalescence length will be at or near a maximum value. The location of this discontinuity is referred to as a jump boundary herein.

Figure 9:
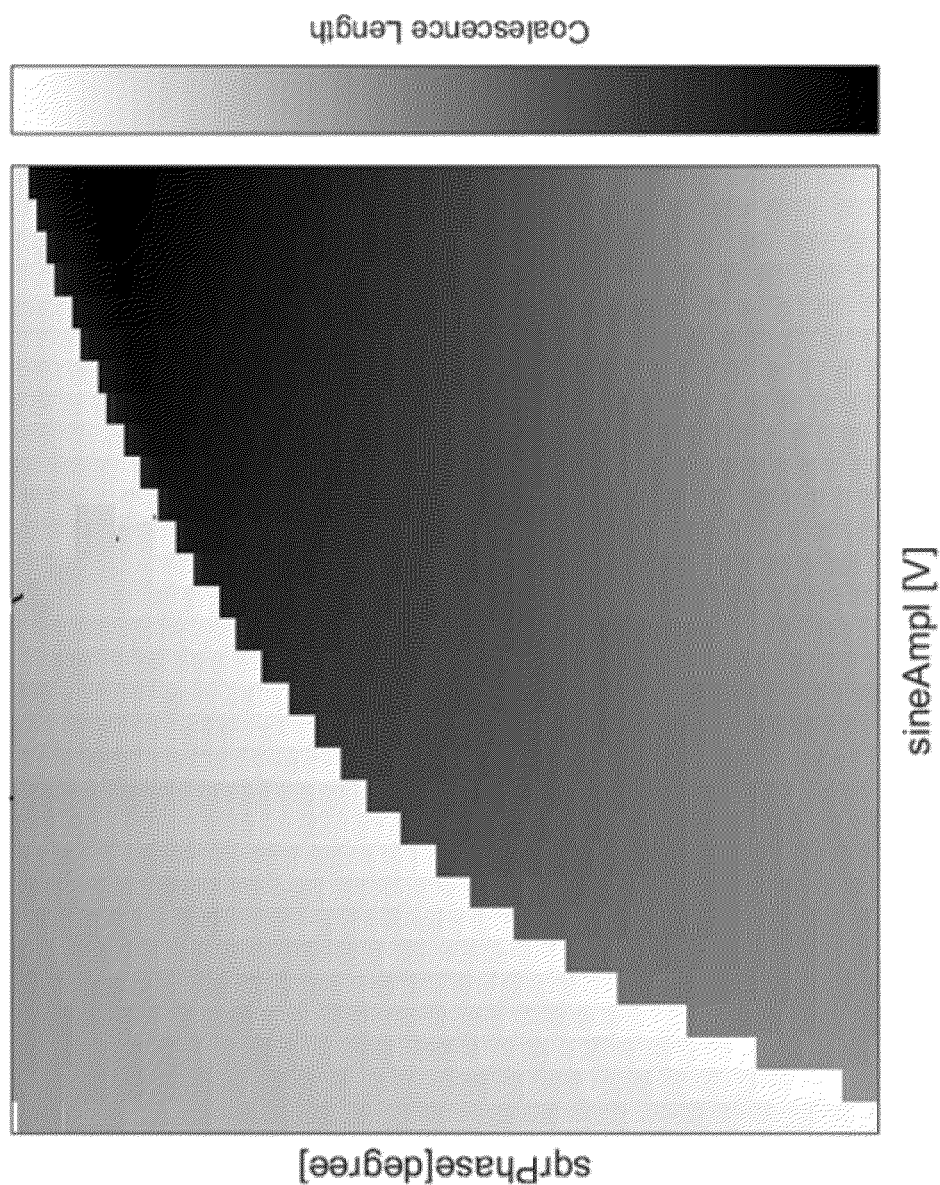
FIG. 9 is a map of coalescence length as a function of sine amplitude and square phase according to one aspect of an embodiment.

Another way of regarding this phenomenon is to consider the square phase which causes the discontinuity as a function of the amplitude of the sine component. This is shown in FIG. 9. In FIG. 9 the x-axis is increasing sine amplitude and the y-axis is increasing square phase. The shades of grey ranging from darker to lighter represent changes in coalescence length with darker representing shorter and lighter representing longer. The resulting boundary between areas of maximum coalescence length (lightest) and areas of minimum coalescence length (darkest) defines a curve showing the dependence of the location of the jump boundary as a function of sine amplitude.

The jump boundary curve in FIG. 9 provides a tool for determining the position of the jump boundary for various values of the sine amplitude from a measurement of just one position of the jump boundary curve. In other words, once the shape of part of the curve has been determined the shape of the other parts of the curve can be determined by extrapolation. The curve can be calibrated for different drag conditions by using a lookup table showing the y-displacement of the curve for different drag conditions.

Figure 10:
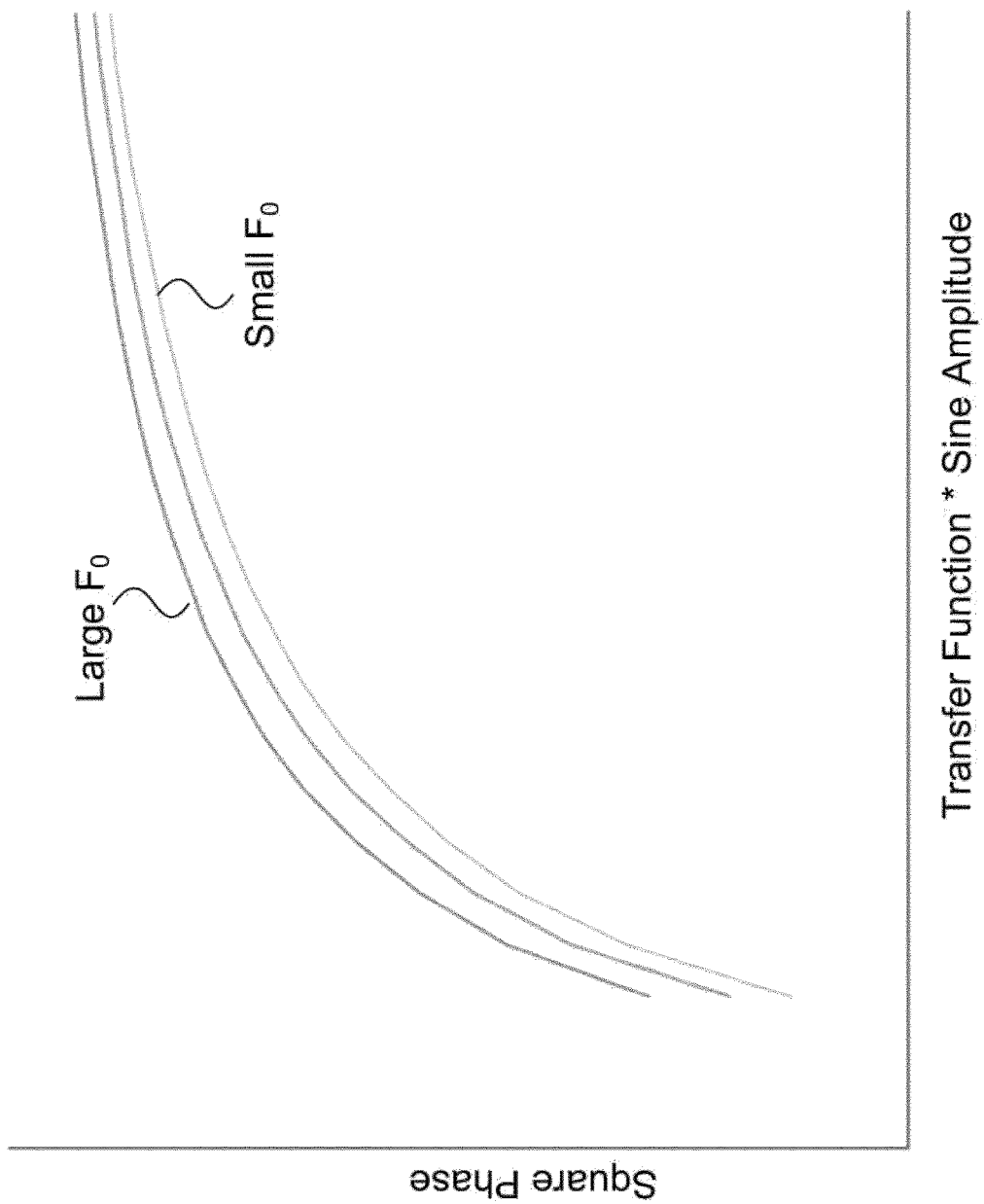
FIG. 10 is a graph showing the effect of drag force magnitude on the relationship between (1) the product of a nozzle transfer function and sine amplitude and (2) square phase according to one aspect of an embodiment.
Figure 11:
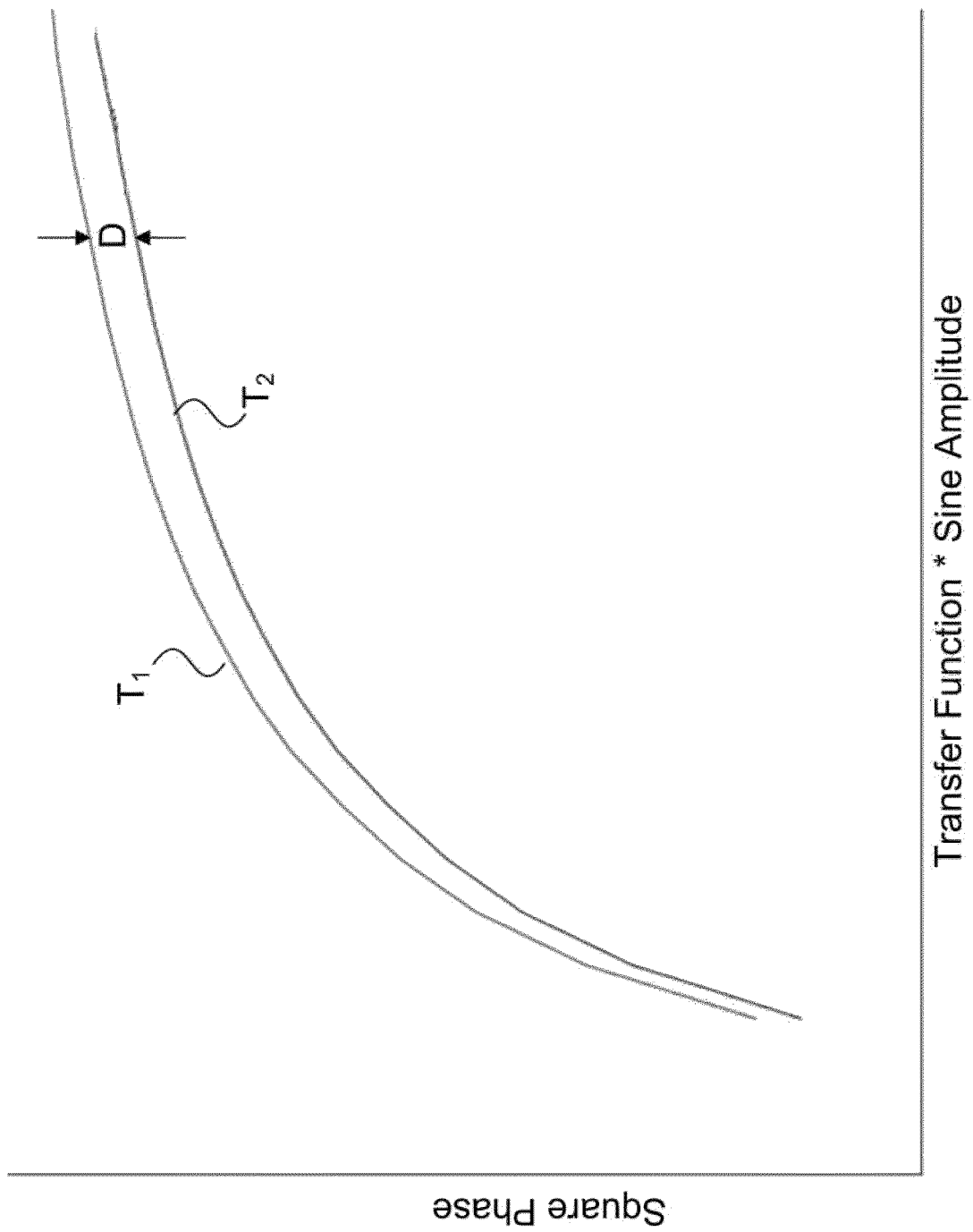
FIG. 11 is a graph showing the effect of the passage of time on the relationship between (1) the product of a nozzle transfer function and sine amplitude and (2) square phase according to one aspect of an embodiment.

The jump boundary curve depends on square-uptime, square-amplitude and can also change with time (phase drift). In general, however, the shapes of the curves defined by this dependence will remain substantially the same with changes in time or drag force and instead the effects of these changes will be a phase-drift which will shift these curves along the y axis. This is shown in FIG. 10 and FIG. 11. FIG. 10 shows three jump boundary curves—one marked Large $F_0$ showing a curve where drag force is relatively larger, one marked Small $F_0$ showing a curve where drag force is relatively smaller, and an unmarked intermediate curve for a drag force having an intermediate magnitude. As can be seen, the curves have essentially the same shape and are simply shifted vertically from one another. The amount of shift is this indicative of the magnitude of the drag force. FIG. 11 indicates, however, that the shift in curves may also be at least partly attributable to the passage of time.

Figure 12:
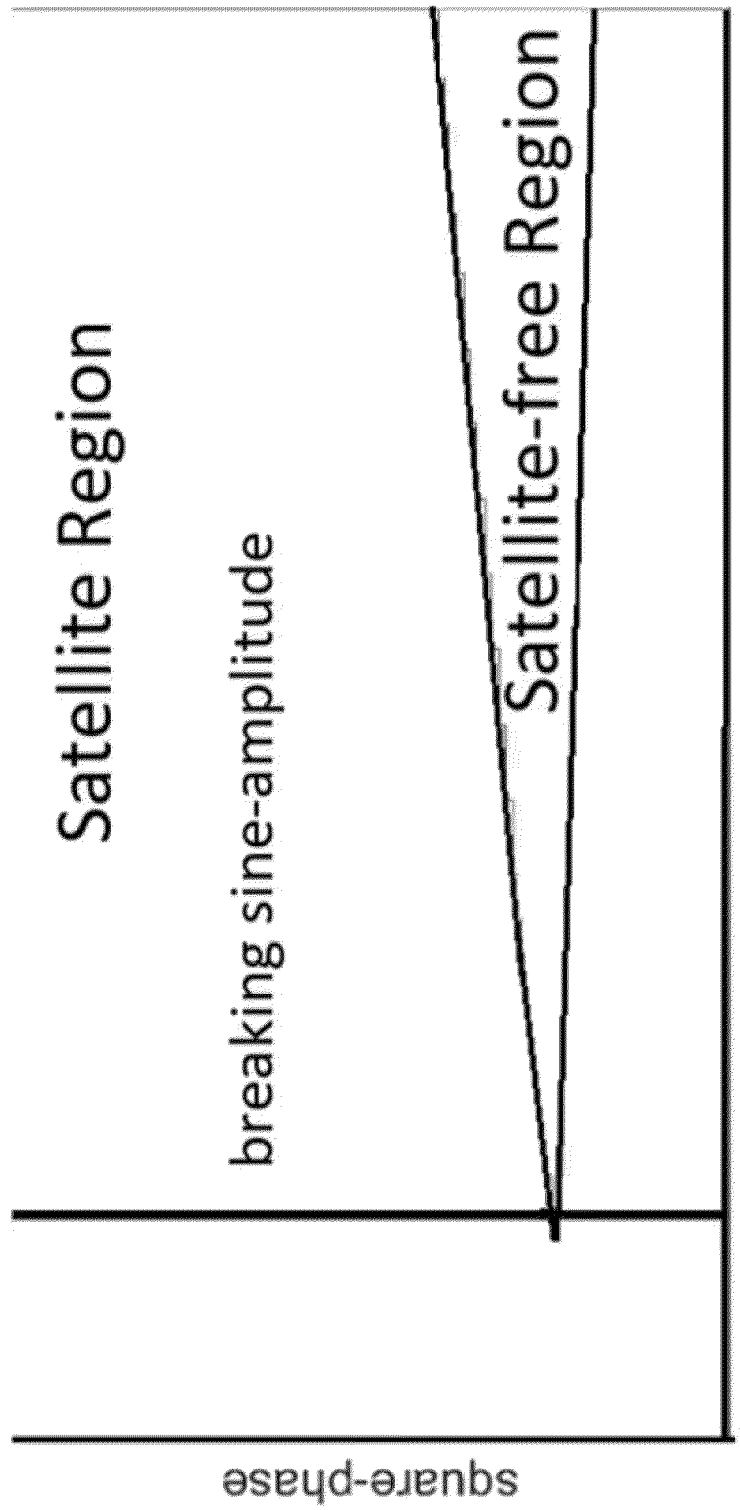
FIG. 12 is a diagram illustrating the configuration of a satellite free region of operation as a function of square phase and breaking sine amplitude according to one aspect of an embodiment.
Figure 13:
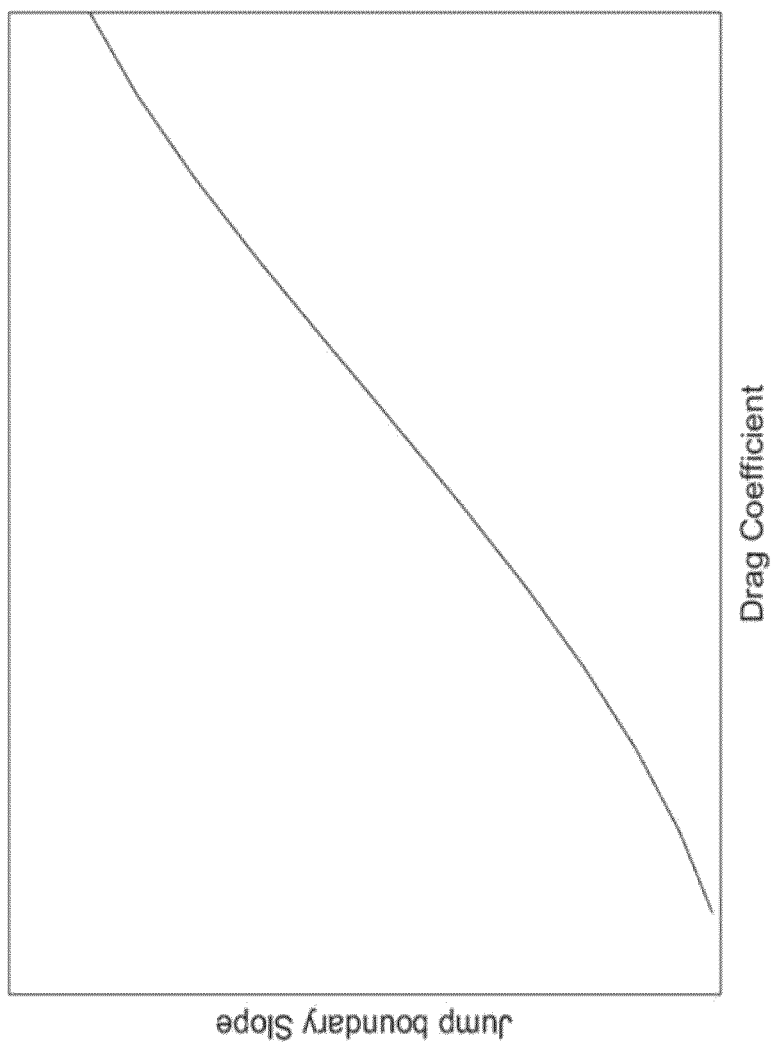
FIG. 13 is a diagram illustrating a relationship of the jump boundary slope and drag coefficient according to one aspect of an embodiment.
Figure 14:
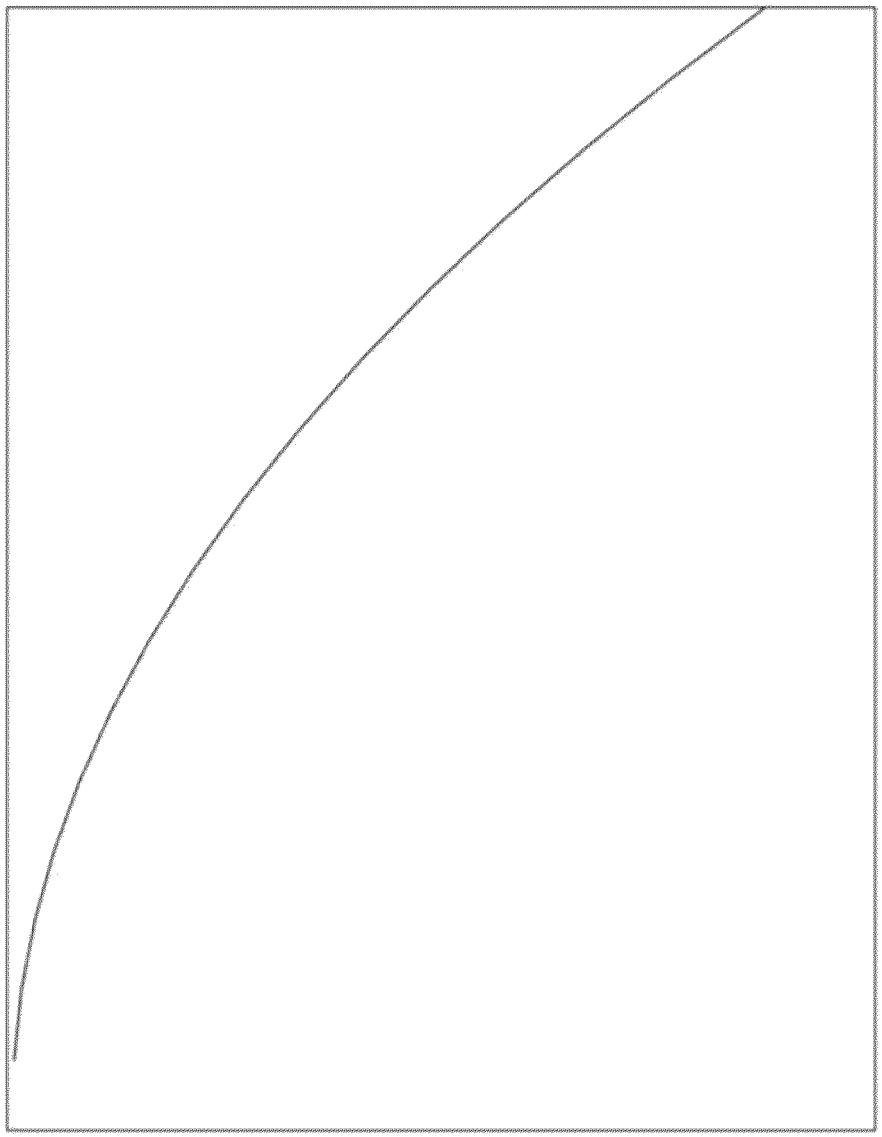
FIG. 14 is a diagram illustrating a relationship of the drag coefficient with the nozzle transfer function and the breaking sine amplitude according to one aspect of an embodiment.

The drag and transfer function can also be determined from the breaking sine amplitude and the slope of the curve defining the dependence of the jump boundary on sine amplitude. In FIG. 12, first the breaking sine amplitude is determined by doing recursive phase scans at different sine amplitudes. From this, the curve defining the dependence of the jump boundary on sine amplitude is established. Thus the jump boundary curve can also be used to determine drag coefficient (FIG. 13). The transfer function can be calculated based on the breaking sine amplitude and the drag coefficient. (FIG. 14). Note that the jump boundary can be determined without determining the crossing interval as the transfer function is essentially the horizontal scale of the curve of jump boundary dependence on the sine amplitude.

Once the jump boundary is determined it is also possible to select operating conditions which will minimize the coalescence length in a way that does not put the coalescence length to near the jump boundary. The coalescence length obtained using this procedure is smaller than that obtained using other techniques, which is desirable because it provides margin with respect to flow and plasma disturbances. The above method also minimizes the likelihood of generating plasma induced satellites.

The above provides a method for estimating the nozzle transfer function as the transfer function is simply the scale of the horizontal axis. It is also a method for optimizing the parameters of hybrid waveform excitation signal. It also provides a new method to determine the vessel pressure and the drag coefficient in the vessel Statistical measures of the variation in the crossing interval such as the value of 3-sigma of crossing intervals will increase at the vicinity of the jump boundary. This is an alternative way to find the position of jump boundary based on crossing intervals without using the satellite detector metrology.

As mentioned, quantifying these parameters permits characterization of satellite formation, the jump boundary, and coalescence length even if the satellite detection metrology is remote from the nozzle and these conditions are not directly observable.

Figure 15:
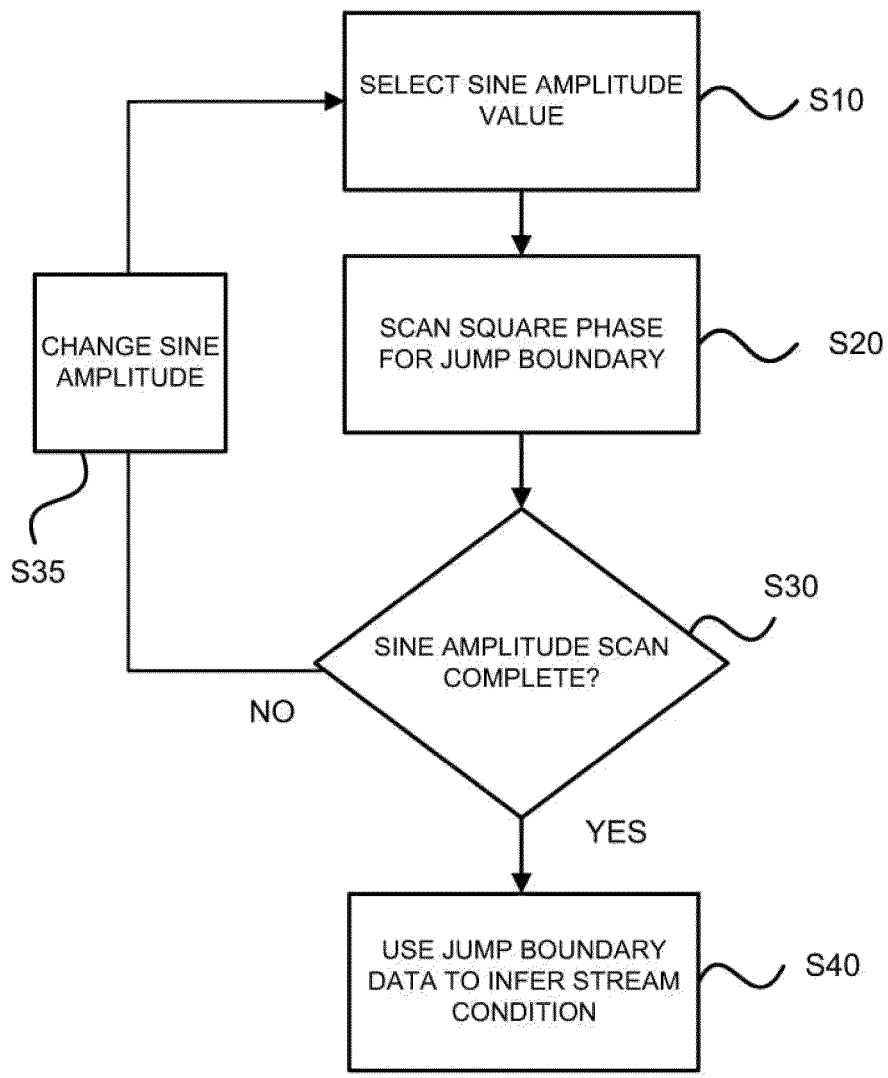
FIG. 15 is a flow chart showing a process for inferring the presence or absence of satellite droplets using jump boundary data according to one aspect of an embodiment.

Expressed on terms of a flowchart, as shown in FIG. 15, according to one aspect a stream condition such as coalescence length or satellite condition (presence or absence) can be inferred from jump boundary data. In a first step S10 a sine amplitude value is selected. In a step S20 a square phase is scanned for the then-current sine amplitude and the jump boundary is determined as the combination of sine amplitude and square phase for which the coalescence length increases abruptly, that is, exhibits a discontinuity. In a step S30 it is determined whether a square phase scan has been conducted for all desired values of sine amplitude. If yes, then in step S40 the jump boundary data is used during operation to infer the stream condition (in the figure, satellite condition as an example) at a given combination of sine amplitude and square phase. If not, then in a step S35 the sine amplitude is changed and the process reverts to step S10.

As mentioned, when forming droplets using the hybrid waveform, first the microdroplets, that is, the droplets first forming from the breakup of the stream leaving the nozzle of the droplet generator, coalesce into the higher frequency (typically 500 kHz) droplets referred to herein as subcoalesced droplets. These subcoalesced droplets then in turn coalesce into fully coalesced main frequency (typically 50 kHz) droplets. Ideally during operation none of these microdroplets or subcoalesced droplets reach the irradiation site. When they do, any of these higher frequency subcoalesced droplets reaching the primary focus are referred to herein as subcoalesced satellite droplets. Any of the microdroplets reaching the primary focus will be referred to as microdroplet satellites. Additional techniques for optimizing the parameters of the hybrid waveform excitation signal use the position and size information of droplets and satellites.

Figure 16:
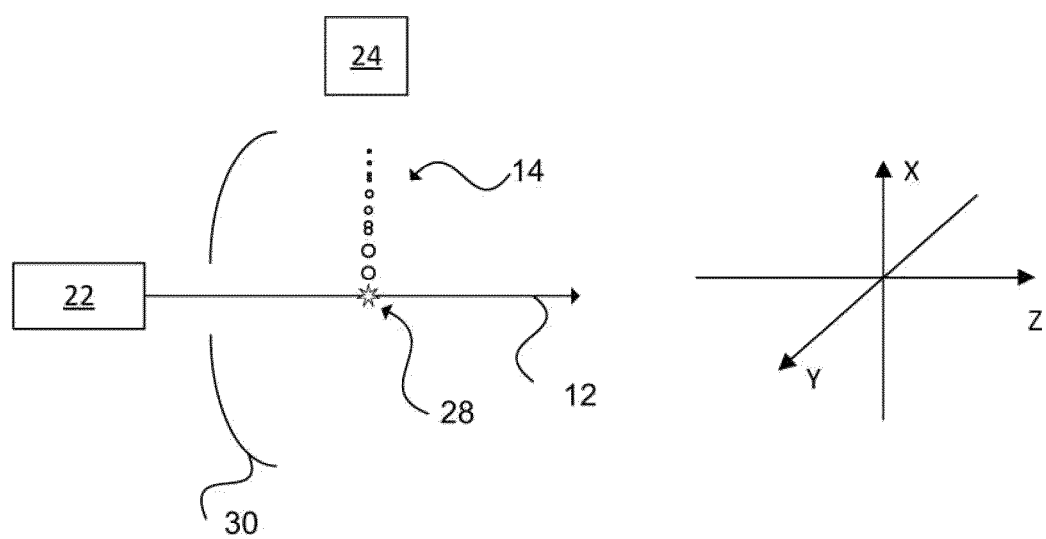
FIG. 16 is a diagram illustrating certain conventions in coordinate systems used to describe EUV radiation generation according to one aspect of an embodiment.

As mentioned, in general, for a reference coordinate system, as shown in the conceptual drawing FIG. 16 of the EUV system, Z is the direction along which the laser beam 12 propagates and is also the direction from the collector 30 to the irradiation site or primary focus 28 and the EUV intermediate focus. X is in the droplet propagation plane. Y is orthogonal to the XZ plane. To make this a right-handed coordinate system, the trajectory of the droplet stream 14 is taken to be in the −X direction. The origin is taken as the irradiation site 28. The presence of satellite droplets in the stream at the irradiation site 28 can be detected by any one or combination of several methods, for example, the use of a DDM or DFC which observe the stream at the irradiation site.

Figure 17:
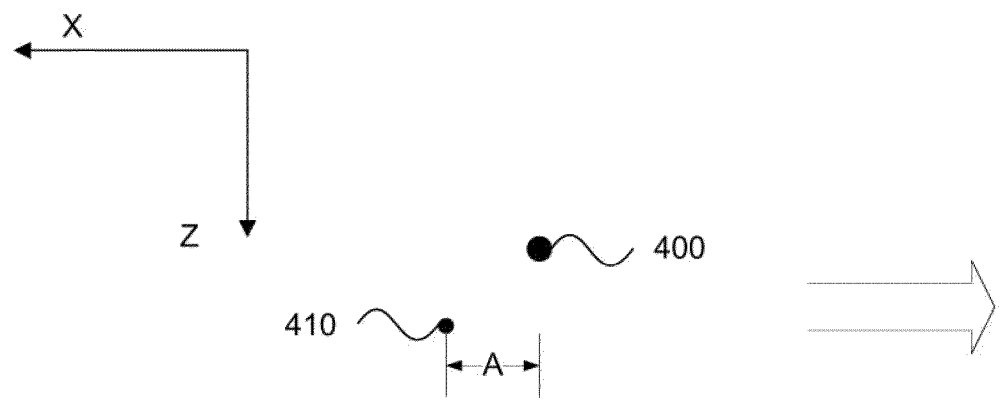
FIG. 17 is a diagram illustrating a relationship between positions of droplets according to one aspect of an embodiment.
Figure 18:
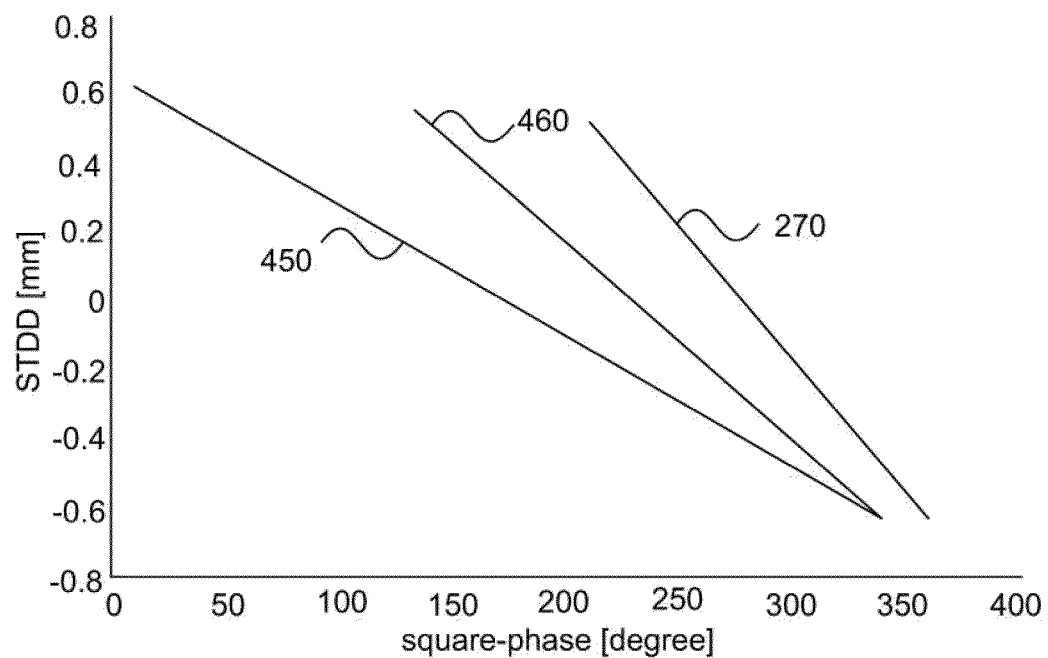
FIG. 18 is a graph illustrating a relationship of the square phase and droplet position as it relates to a nozzle transfer function according to one aspect of an embodiment.

As shown in FIG. 17 there is a range for sine-amplitude that each fully coalesced droplet 400 has a sub-coalesced satellite droplet 410 in its vicinity, displaced in the −X direction of propagation of the stream as indicated by the arrow, also referred to as streamwise herein, from the fully coalesced droplet. The distance between the droplet to satellite in X direction, labelled "A" in the figure, is referred to as STDD (Satellite-to-Droplet Distance). STDD is a linear function of square-phase as shown on FIG. 18. In FIG. 18 the line labelled 450 shows a simulation of STDD vs. square phase with the sine amplitude at a first value, the line labelled 460 shows a simulation of STDD vs. square phase with the sine amplitude at a second value, and the line labelled 470 shows a simulation of STDD vs. square phase with the sine amplitude at a third value. The slopes of these lines are a measurement of transfer function*sine-amplitude and so can be used to determine the nozzle transfer function.

The analytical expression that quantifies the relationship between STDD and square phase, denoted by ϕ, is determined as follows:

$$\frac{d}{d\phi}STDD = TF * sineAmpl \frac{\sin\left(\frac{\pi}{N_{freq}}\right)N_{freq}}{\pi(N_{freq}-1)} \frac{LDFC}{U0},$$

where TF is the transfer function, LDFC is a streamwise distance between the end of the droplet generator nozzle and a position where an image of the stream is captured by a camera positioned to view the stream, and U0 is the velocity of the main coalesced droplet.

The nozzle transfer function is an important indicator of the operational state of the droplet generator in that it indicates the amount of voltage the droplet generator requires to impose a given relative velocity on the droplets. This relative velocity determines how quickly the droplets coalesce. The transfer function can be used to guide swap decisions, e.g. replacing a droplet generator if it cannot generate enough relative velocity at a maximum input voltage to achieve full coalescence at an acceptable distance before reaching the irradiation region.

Figure 19:
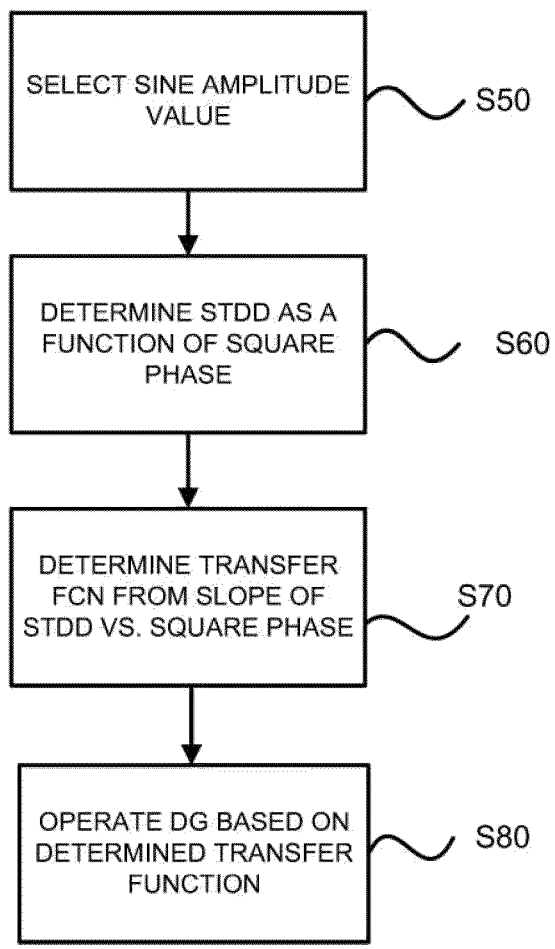
FIG. 19 is a flow chart showing a process for determining a transfer function of a droplet generator according to one aspect of an embodiment.

Expressed in terms of a flowchart, as shown in FIG. 19, according to one aspect a sine amplitude value is selected in a step S50. In a step S60 a functional dependence of STDD on square phase is determined at the selected sine amplitude. In a step S70 the transfer function is determined from the slope of the functional dependence determined in step S60. In a step S80 the droplet generator (DG in the figure) is operated in accordance with the determined transfer function, including without limitation the possible evaluation of the droplet generator for servicing or replacement depending on the transfer function.

There are multiple methods by which subcoalesced satellite droplets may be detected. Another is using an imager such as a DFC to determine whether the size of all satellite droplets corresponds to a known size of subcoalesced droplets. Here and elsewhere "corresponds" means that the size of the satellite is closer to the size of a subcoalesced droplet than it is to the size of a fully coalesced droplet or a microdroplet. s is equal to higher frequency droplets.

Figure 20:
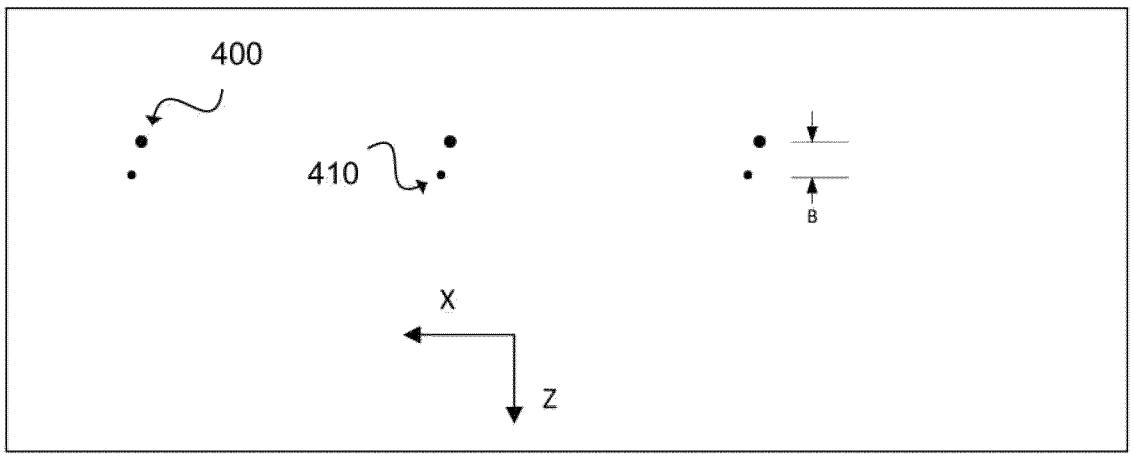
FIG. 20 is a diagram illustrating a relationship between positions of droplets according to one aspect of an embodiment.

Another method of detecting subcoalesced satellite droplets is based on the coordinate of the position of the satellite in the lateral (Z) direction is an indirect measurement of droplet size. Hydrogen flows in the chamber separate fully coalesced droplets and smaller droplets in the lateral direction. Thus, sub-coalesced satellite droplets are translated a specific distance B from the main fully coalesced droplet in Z direction as shown in FIG. 20 for a given flow condition in the chamber.

Figure 21:
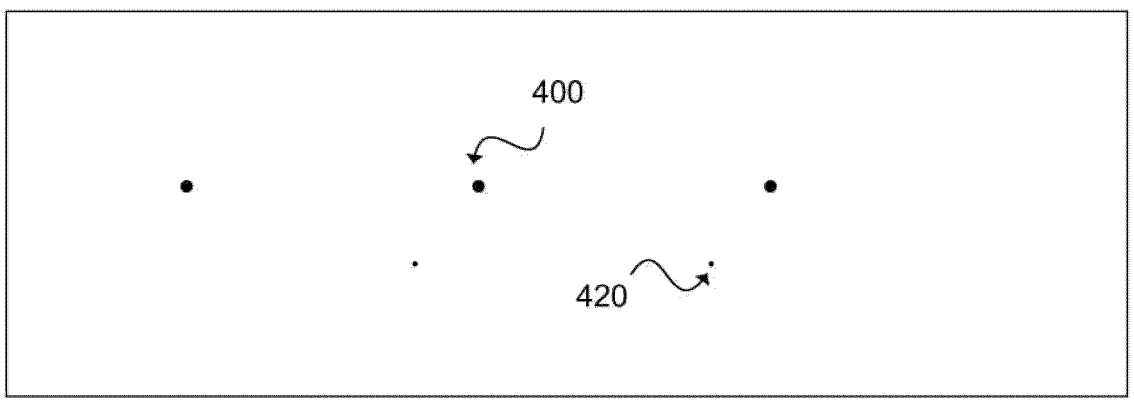
FIG. 21 is a diagram illustrating a relationship between positions of droplets according to one aspect of an embodiment.

The position and size information of droplets and satellites can also be used to measure sub-coalescence length, that is, the distance from the nozzle exit to the position at which the microdroplets have coalesced into subcoalesced droplets. One technical challenge in hybrid waveform tuning is that increasing sine-amplitude can cause main coalescence and sub-coalescence to interfere. As the main coalescence length is reduced, the sub-coalescence process is affected by the strong velocities that are generated by the lower frequency (sine) part of the signal. In other words, a microdroplet satellite will be observed as the voltage of the lower frequency part of the signal increases as shown in FIG. 21. The sub-coalescence length can be determined by measuring the minimum sine-amplitude value which generates a microdroplet satellite. Thus, the sub-coalescence length can be used as an objective function in the optimization process of the sub-coalescence parameters (square-uptime, square-amplitude). The process also provides an upper bound for sine-amplitude value which can be used for optimization of the sine-amplitude. This can be used as a parameter for assessing the operational status of the droplet generator.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance. The breadth and scope of the present invention should not be limited by any of the above-described exemplary embodiments, but should be defined only in accordance with the following claims and their equivalents.

Other aspects of the invention are set out in the following numbered clauses.

1. Apparatus comprising:
a target material dispenser having a nozzle and adapted to provide a stream of target material that breaks up into first droplets after exiting the nozzle;
an electro-actuatable element mechanically coupled to the target material dispenser and arranged to induce velocity perturbations in the stream based on an applied waveform, the velocity perturbations causing the first droplets to ultimately coalesce in one or more stages into second droplets larger than the first droplets within a coalescence distance from the nozzle; and
a waveform generator electrically coupled to the electro-actuatable element and adapted to generate the applied waveform, the waveform having a sine wave component and a square wave component, the sine wave component having an amplitude and the square wave component having a phase difference from the sine wave component, the amplitude and the phase difference being selected to minimize the coalescence distance while avoiding an abrupt change in the coalescence distance.

2. Apparatus as in clause 1 wherein the electro-actuatable element is a piezoelectric element.

3. Apparatus comprising:
a target material dispenser having a nozzle and adapted to provide a stream of target material that breaks up into first droplets after exiting the nozzle;
an electro-actuatable element mechanically coupled to the target material dispenser and arranged to induce velocity perturbations in the stream based on an applied waveform, the velocity perturbations causing the first droplets to ultimately coalesce in one or more stages into second droplets larger than the first droplets within a coalescence distance from the nozzle, the second droplets being spaced such that the second droplets pass a fixed point at a crossing interval;

a crossing interval detector arranged to determine the crossing interval of the second droplets and to generate a crossing interval signal; and
a waveform generator electrically coupled to the electro-actuatable element and adapted to generate the applied waveform and adapted to generate the applied waveform based at least in part on the crossing interval signal.

4. A method comprising:
providing a stream of target material using a target material dispenser, the target material dispenser comprising an electro-actuatable element arranged to induce velocity perturbations in the stream based on a droplet control signal;
determining whether the stream includes satellite droplets and generating a satellite detection signal indicating whether the stream includes satellite droplets;
generating a waveform based at least in part on the satellite detection signal; and
supplying the waveform to the target material dispenser.

5. A method as in clause 4 further comprising determining a crossing interval of the stream and generating a crossing interval signal and wherein the step of generating a waveform comprises generating the waveform based at least in part on the crossing interval signal.

6. A method of determining a transfer function of a nozzle of a target material dispenser, the method comprising:
dispensing a stream of EUV target material from the target material dispenser;
applying a waveform to an electro-actuatable element arranged to induce velocity perturbations in the stream in response to the control signal;
determining a minimum value of an amplitude of a sine wave component of the waveform for which the stream does not include satellites;
determining a dependence of coalescence length on a phase difference between the sine wave component and a square wave component of the control signal and determining a jump boundary phase difference at which a discontinuity in the dependence occurs;
determining a slope of a dependence of the jump boundary phase on the minimum value;
determining a drag coefficient based on the slope; and
determining a transfer function at a frequency of the sine wave component based on the minimum value and the drag coefficient.

7. A method of optimizing coalescence behavior for a stream of EUV target material from a target material dispenser comprising an electro-actuatable element arranged to induce velocity perturbations in the stream in response to an applied control signal, the method comprising:
determining a minimum value of an amplitude of a sine wave component of the control signal for which the stream does not include satellites;
determining a dependence of coalescence length on a phase difference between the sine wave component and a square wave component of the control signal and determining a jump boundary phase difference at which a discontinuity in the dependence occurs;
determining a slope of a dependence of the jump boundary phase on the minimum value;
determining a drag coefficient based on the slope;
determining a designed phase delay based on the drag coefficient; and determining an optimum phase difference as a difference between the jump boundary phase difference and the designed phase delay.

8. A method of controlling coalescence behavior for a stream of EUV target material from a target material dispenser comprising an electro-actuatable element arranged to induce velocity perturbations in the stream in response to an applied control signal having a sine wave component and a square wave component, the method comprising:

determining a width $L_n$ of a largest range of adjacent values of a phase difference between the sine wave component and the square wave component for which the stream does not include satellites;

determining a width $L_2$ of a largest range of adjacent values of the phase difference between the sine wave component and the square wave component for which the stream does include satellites;

determining a value $S_m$ as a statistical measure of variation in the stream crossing interval in the range having width $L_n$;

determining a value YZstability as a statistical measure of a vector $[ry_m, rz_m]$ where $ry_m$ is as a statistical measure of stability of the stream in a y direction and $rz_m$ is a as a statistical measure of stability of the stream in a z direction; and determining a cost function $$W_1 YZStability + W_2 S_m + W_3 \frac{(L_n - L_1)}{L_n} + W_4 \frac{(2\pi - L_n - L_2)}{(2*pi - L_n)},$$

where $W_1$, $W_2$, $W_3$, $W_4$ are some real positive numbers; and adjusting parameters of the sine wave component and the square wave component to minimize the cost function.

9. A method comprising:

using a target material dispenser having a nozzle to provide a stream of target material that breaks up into first droplets after exiting the nozzle;

using an electro-actuatable element mechanically coupled to the target material dispenser to induce velocity perturbations in the stream based on an applied waveform, the velocity perturbations causing first droplets to ultimately coalesce in one or more stages into second droplets larger than the first droplets within a coalescence distance from the nozzle; and using a waveform generator electrically coupled to the electro-actuatable element to generate the applied waveform, the waveform having a sine wave component and a square wave component, the sine wave component having an amplitude and the square wave component having a phase difference from the sine wave component, the amplitude and the phase difference being selected to minimize the coalescence distance while avoiding an abrupt change in the coalescence distance.

10. A method of operating a target material dispenser in an EUV source, the method comprising: generating a waveform having a sine wave component and a square wave component, the sine wave component having an amplitude and the square wave component having a phase difference from the sine wave component;

applying the waveform to an electro-actuatable element mechanically coupled to the target material dispenser having a nozzle to provide a stream of target material that breaks up into first droplets after exiting the nozzle and then coalesces in one or more stages into second droplets larger than the first droplets within a coalescence distance from the nozzle;

for a plurality amplitudes, scanning a plurality of phase differences to identify jump boundary combinations of amplitude and phase difference at which an abrupt change in the coalescence distance occurs; to generate a jump boundary curve; and during operation of the EUV source, using combinations of amplitude and phase difference based at least in part on the jump boundary curve.

11. A method comprising:

releasing of a stream of initial droplets of a first size from a droplet generator under control of an electric signal, the stream of initial droplets undergoing at least one coalescence into a stream of final droplets of a second size larger than the first size after travelling a coalescence length, the electric signal having a first periodic component and a second periodic component out of phase from the first periodic component by a phase difference;

operating the droplet generator with the phase difference at a value at which the stream of final droplets does not include any satellite droplets smaller than the second size; and varying the value of the phase difference to a value at which a satellite droplet occurs in the stream of final droplets to detect a jump boundary in a functional dependence of coalescence length on the value of the phase difference.

12. A method as in clause 11 wherein operating the droplet generator with the phase difference at a value at which the stream of final droplets does not include any satellite droplets smaller than the second size comprises operating the droplet generator with the phase difference at a value expected to be below the value at which a satellite droplet occurs in the stream of final droplets, and varying the value of the phase difference phase until a satellite droplet occurs in the stream of final droplets to detect a jump boundary in a functional dependence of coalescence length on the value of the phase difference comprises increasing the value of the phase difference phase until a satellite droplet occurs in the stream of final droplets to detect a jump boundary in a functional dependence of coalescence length on the value of the phase difference.

13. A method as in clause 11 wherein the first periodic component has a first frequency and the second periodic component has a second frequency which is an integral multiple including one of the first frequency.

14. A method as in clause 11 wherein one of the first periodic and the second periodic components is sinusoidal and the other of the first periodic and the second periodic components is a square wave.

15. A method of controlling coalescence behavior for a stream of EUV target material from a target material dispenser comprising an electro-actuatable element arranged to induce velocity perturbations in the stream in response to an applied control signal having a sine wave component and a square wave component, the method comprising:

determining a first number of ranges of adjacent values of a phase difference between the sine wave component and the square wave component for which the stream does not include satellites;

determining a second number of ranges of adjacent values of the phase difference between the sine wave component and the square wave component for which the stream does include satellites; and determining coalescence behavior of the stream of EUV target material to be acceptable if the first number and the second number are equal to one.

16. A method comprising:

providing a stream of fully coalesced droplets of target material using a target material dispenser, the target material dispenser comprising an electro-actuatable element arranged to induce velocity perturbations in the stream based on a droplet control signal;

determining whether the stream further includes subcoalesced satellite droplets and generating a subcoalesced droplet detection signal indicating whether the stream includes subcoalesced satellite droplets;

generating a waveform based at least in part on the subcoalesced droplet detection signal; and supplying the waveform to the electro-actuatable element in the target material dispenser.

17. A method as in clause 1 wherein determining whether the stream includes subcoalesced satellite droplets comprises determining whether a size of any satellite droplets corresponds to a known size of a subcoalesced droplet.

18. A method as in clause 1 wherein determining whether the stream includes subcoalesced satellite droplets comprises determining a magnitude of a streamwise displacement of any satellite droplets from a fully coalesced droplet.

19. A method comprising:

providing a stream of coalesced droplets of target material using a target material dispenser, the target material dispenser comprising an electro-actuatable element arranged to induce velocity perturbations in the stream based on a droplet control signal, the control signal having a sine component;

determining a minimum value of a magnitude of an amplitude of the sine component at which satellite microdroplets appear in the stream;

determining a sub-coalescence length based on the minimum value; and controlling operation of the target material dispenser based on the determined sub-coalescence length.

20. A method comprising:

providing a stream of coalesced droplets of target material using a target material dispenser, the target material dispenser comprising a nozzle and an electro-actuatable element arranged to induce velocity perturbations in the stream exiting the nozzle based on a droplet control signal to produce a stream which breaks up into microdroplets, the control signal having a sine component and a square wave component out of phase with the sine component by a phase difference;

determining a dependence of a magnitude of a streamwise displacement of any satellite microdroplets from the coalesced droplets on a magnitude of the phase difference;

determining a transfer function between the control signal to the velocity perturbations at an exit of the nozzle based on the dependence; and controlling operation of the target material dispenser based on the determined transfer function.

The invention claimed is:

1. Apparatus comprising:

a target material dispenser having a nozzle and adapted to provide a stream of target material that breaks up into first droplets after exiting the nozzle;

an electro-actuatable element mechanically coupled to the target material dispenser and arranged to induce velocity perturbations in the stream based on an applied waveform, the velocity perturbations causing the first droplets to ultimately coalesce in one or more stages into second droplets larger than the first droplets within a coalescence distance from an exit of the nozzle; and a waveform generator electrically coupled to the electro-actuatable element and adapted to generate the applied waveform, the waveform having a sine wave component and a square wave component, the sine wave component having a first frequency and the square wave component having a second frequency greater than the first frequency, the sine wave component having an amplitude and the square wave component having a phase difference from the sine wave component, the amplitude and the phase difference being selected to control a magnitude of the coalescence distance while avoiding an abrupt change in the magnitude of the coalescence distance.

2. A method comprising:

using a target material dispenser having a nozzle and adapted to provide a stream of target material that breaks up into first droplets after exiting the nozzle;

using an electro-actuatable element mechanically coupled to the target material dispenser and arranged to induce velocity perturbations in the stream based on an applied waveform, the velocity perturbations causing the first droplets to ultimately coalesce in one or more stages into second droplets larger than the first droplets within a coalescence distance from an exit of the nozzle; and using a waveform generator electrically coupled to the electro-actuatable element and adapted to generate the applied waveform, the waveform having a sine wave component and a square wave component, the sine wave component having a first frequency and the square wave component having a second frequency greater than the first frequency, the sine wave component having an amplitude and the square wave component having a phase difference from the sine wave component, the amplitude and the phase difference being selected to control a magnitude of the coalescence distance while avoiding an abrupt change in the magnitude of the coalescence distance.

3. A method comprising:

providing a stream of target material that breaks up into first droplets after exiting a nozzle; and applying a waveform to an electro-actuatable element coupled to the nozzle, the waveform having a sine wave component and a square wave component, the sine wave component having a first frequency and the square wave component having a second frequency greater than the first frequency, the sine wave component having an amplitude and the square wave component having a phase difference from the sine wave component, the waveform inducing velocity perturbations in the stream causing the first droplets to ultimately coalesce in one or more stages into second droplets larger than the first droplets within a coalescence distance from an exit of the nozzle, the amplitude and the phase difference being selected to control a magnitude of the coalescence distance while avoiding an abrupt change in the magnitude of the coalescence distance.

\* \* \* \* \*